US010172267B2

(12) United States Patent
Iwaki et al.

(10) Patent No.: US 10,172,267 B2
(45) Date of Patent: Jan. 1, 2019

(54) COMPONENT SUPPLY DEVICE

(71) Applicant: FUJI CORPORATION, Chiryu-shi (JP)

(72) Inventors: Noriaki Iwaki, Hekinan (JP); Shunji Morikawa, Toyoake (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 15/505,858

(22) PCT Filed: Aug. 25, 2014

(86) PCT No.: PCT/JP2014/072166
§ 371 (c)(1),
(2) Date: Feb. 22, 2017

(87) PCT Pub. No.: WO2016/030946
PCT Pub. Date: Mar. 3, 2016

(65) Prior Publication Data
US 2017/0273226 A1    Sep. 21, 2017

(51) Int. Cl.
| | | |
|---|---|---|
| *B65G 47/00* | (2006.01) | |
| *B65G 47/02* | (2006.01) | |
| *B65G 47/04* | (2006.01) | |
| *H05K 13/02* | (2006.01) | |
| *B65G 47/12* | (2006.01) | |

(Continued)

(52) U.S. Cl.
CPC ........... *H05K 13/02* (2013.01); *B65G 11/023* (2013.01); *B65G 11/183* (2013.01); *B65G 11/203* (2013.01); *B65G 47/12* (2013.01); *B65G 65/44* (2013.01); *H05K 13/028* (2013.01); *H05K 13/043* (2013.01); *B25J 15/0616* (2013.01); *B65G 37/00* (2013.01)

(58) Field of Classification Search
None
See application file for complete search history.

(56) References Cited

U.S. PATENT DOCUMENTS

| 5,806,715 A | 9/1998 | Hamuro et al. |
| 6,056,108 A | 5/2000 | Buchi et al. |
| (Continued) | | |

FOREIGN PATENT DOCUMENTS

| EP | 0 916 457 A2 | 5/1999 |
| EP | 3 088 128 A1 | 11/2016 |
| (Continued) | | |

OTHER PUBLICATIONS

International Search Report dated Oct. 7, 2014, in PCT/JP2014/072166 filed Aug. 25, 2014.

(Continued)

*Primary Examiner* — Kavel Singh
(74) *Attorney, Agent, or Firm* — Oblon, McClelland, Maier & Neustadt, L.L.P.

(57) ABSTRACT

A component supply device includes a storage section, a mounting section, and a component support section. The storage section stores multiple components. The storage section is mounted to the mounting section. The storage section is attachable and detachable in relation to the mounting section. The component support section supports, in a scattered state, multiple components which are discharged from an opening of the storage section which is in a state of being mounted to the mounting section.

6 Claims, 20 Drawing Sheets

(51) Int. Cl.
*B65G 65/44* (2006.01)
*B65G 11/02* (2006.01)
*B65G 11/18* (2006.01)
*B65G 11/20* (2006.01)
*H05K 13/04* (2006.01)
*B25J 15/06* (2006.01)
*B65G 37/00* (2006.01)

(56) References Cited

U.S. PATENT DOCUMENTS

| | | | |
|---|---|---|---|
| 6,374,986 B1 * | 4/2002 | Oe ......................... | B65G 15/58 |
| | | | 198/396 |
| 6,481,560 B2 * | 11/2002 | Kearney ............ | B65G 47/1478 |
| | | | 198/396 |
| 8,550,233 B2 * | 10/2013 | Perroud ................ | B65G 27/34 |
| | | | 198/502.2 |

FOREIGN PATENT DOCUMENTS

| JP | 6-6076 A | 1/1994 |
|---|---|---|
| JP | 8-204386 A | 8/1996 |
| JP | 10-202569 A | 8/1998 |
| JP | 11-180538 A | 7/1999 |
| JP | 2009-295618 A | 12/2009 |

OTHER PUBLICATIONS

Extended European Search Report dated Jul. 19, 2017 in European Patent Application No. 14900466.5.

* cited by examiner

COMPONENT SUPPLY DEVICE

TECHNICAL FIELD

The present application relates to a component supply device which is provided with a component support section for supporting multiple components in a scattered state.

BACKGROUND ART

In a known component supply device, multiple components, which are discharged from an opening of a storage section which stores the multiple components, are scattered on a component support section, and the components are supplied in the next step through the operation of a component holding robot or the like from the component support section. An example of such a component supply device is described in the following patent literature.

PTL 1: JP-A-10-202569

SUMMARY

In the component supply device which is described in the above patent literature, when exchanging the type or the like of the components to be supplied, the operation of the device is stopped, and after removing the components from the storage section, it is necessary to store a new type of component in the storage section. Therefore, in order to exchange the components, the work of supplying the components may be stopped and the working efficiency may be lowered. A component exchange work may not be easily performed. The disclosure is made in consideration of such circumstances, and an object of the disclosure is to provide a component supply device capable of easily performing component exchange work, and capable of performing the exchanging of the components without stopping the work of supplying the components.

In order to solve the problem described above, a component supply device described in the disclosure includes a storage section which stores multiple components, a mounting section to which the storage section is mounted, and, a component support section which supports, in a scattered state, multiple components which are discharged from an opening of the storage section which is in a state of being mounted to the mounting section, in which the storage section is attachable and detachable in relation to the mounting section.

Advantageous Effects

In the component supply device described in the disclosure, the storage section which stores multiple components is attachable and detachable in relation to the mounting section. Therefore, when the components of a next step are being supplied from the component support section through an operation of a component holding robot or the like, for example, it is possible to remove the storage section from the mounting section and to attach a component storage section in which a new type of component is stored to the mounting section. Accordingly, it becomes possible to perform exchanging of components without stopping work of supplying the components. Performing the component exchange work becomes easy.

DESCRIPTION OF EMBODIMENTS

Hereinafter, detailed description will be given of the example of the disclosure with reference to the drawings as an embodiment of the disclosure.

<Configuration of Component Mounting Device>

Figure 1:
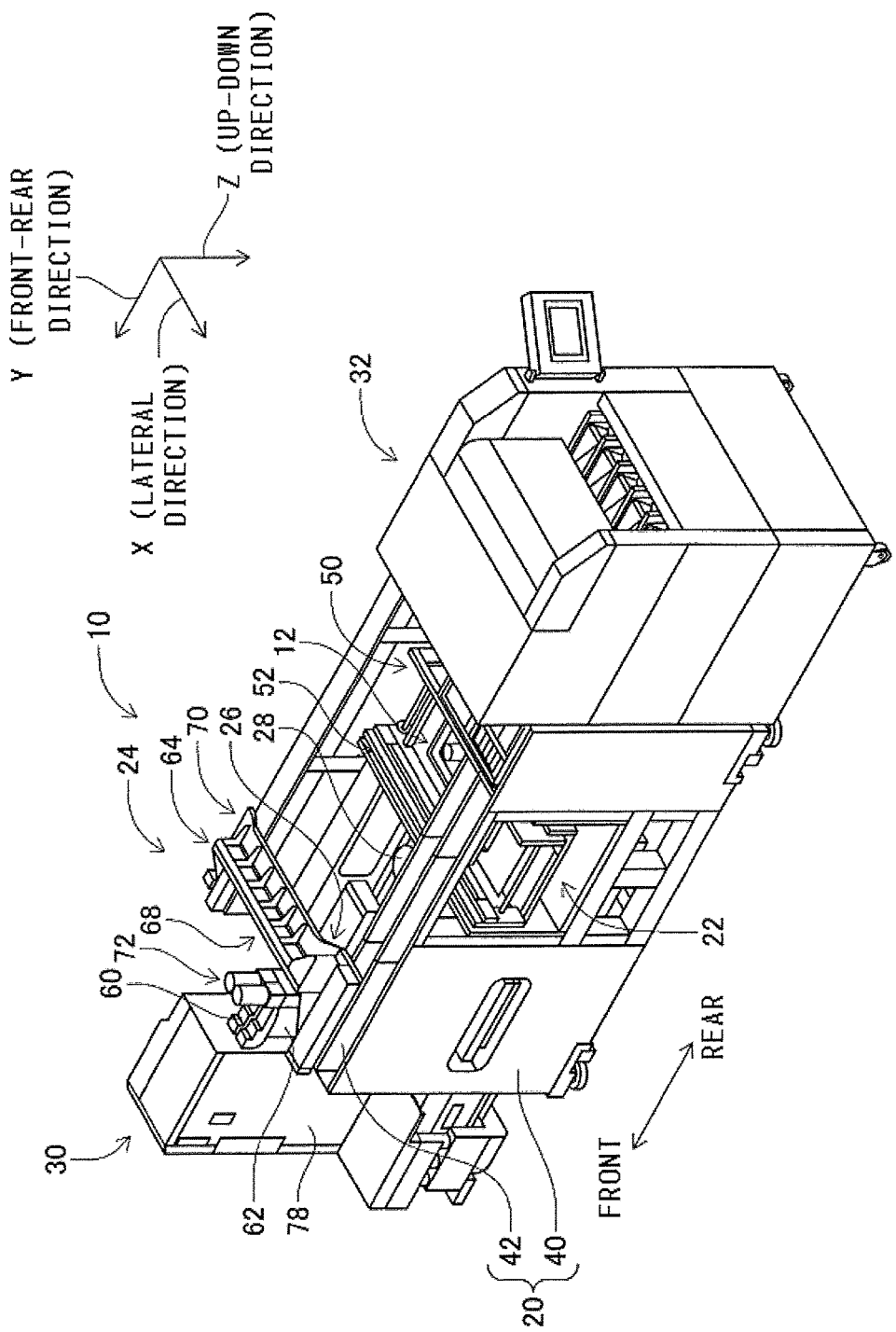
FIG. 1 is a perspective view illustrating a component mounting device.

FIG. 1 illustrates a component mounting device 10. The component mounting device 10 is a device for executing work of mounting components onto a circuit substrate 12. The component mounting device 10 is provided with a device main body 20, a substrate conveying and holding device 22, a component mounting device 24, imaging devices 26 and 28, a component supply device 30, and a bulk component supply device 32. Examples of the circuit substrate 12 include a circuit board, a three-dimensional structure substrate, and the like, and examples of the circuit board include a printed-wiring board, a printed-circuit board, and the like.

The device main body 20 is formed of a frame section 40, and a beam section 42 which bridges over the frame section 40. The substrate conveying and holding device 22 is arranged in the middle of the front-rear direction of the frame section 40, and includes a conveyance device 50 and a clamping device 52. The conveyance device 50 is a device which conveys the circuit substrate 12, and the clamping device 52 is a device which holds the circuit substrate 12. Accordingly, the substrate conveying and holding device 22 conveys the circuit substrate 12 and holds the circuit substrate 12 in a fixed manner at a predetermined position. In the following description, the conveyance direction of the circuit substrate 12 will be referred to as an X-direction, a horizontal direction which is perpendicular to the conveyance direction will be referred to as a Y-direction, and the vertical direction will be referred to as a Z-direction. In other words, the width direction of the component mounting device 10 is the X-direction, and the front-rear direction is the Y-direction.

Figure 2:
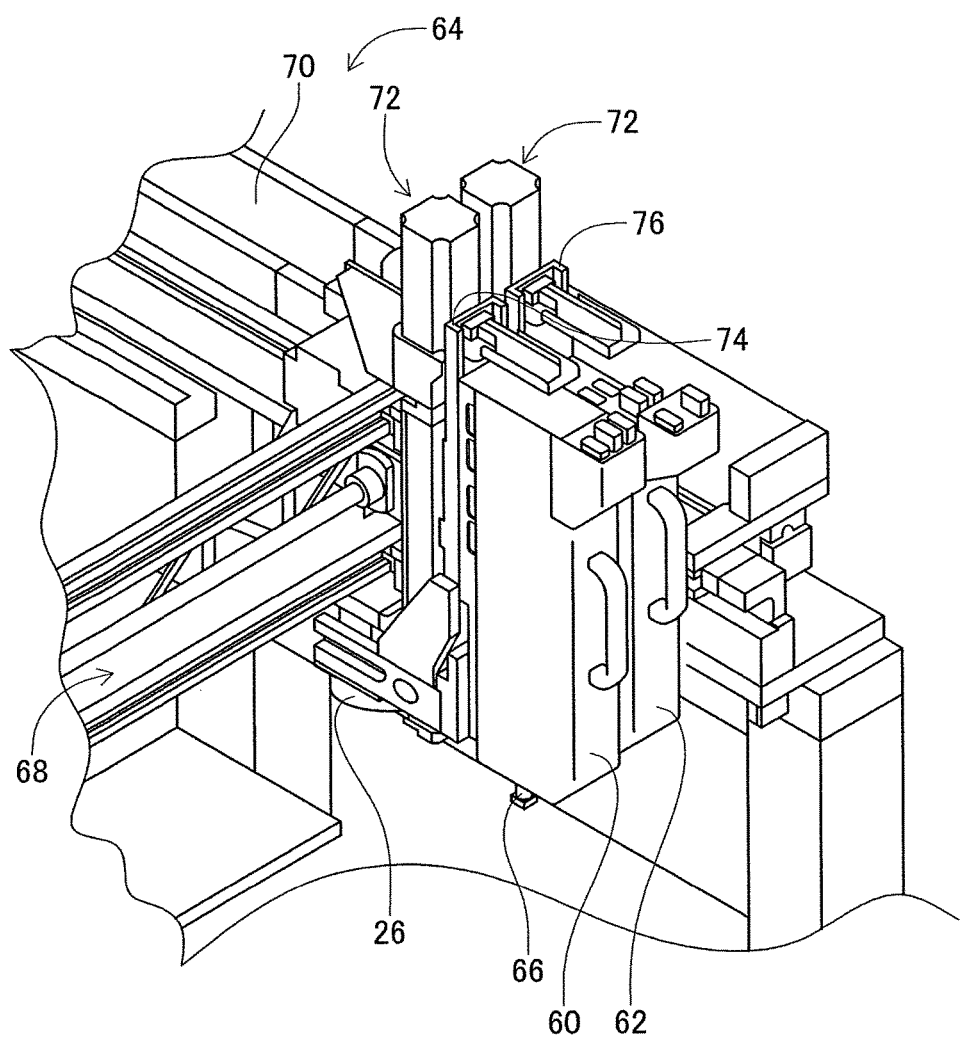
FIG. 2 is a perspective view illustrating a component mounting device of the component installation device.

The component mounting device 24 is arranged on the beam section 42, and includes two work heads 60 and 62, and a work head moving device 64. Each of the work heads 60 and 62 includes a component holding tool (refer to FIG. 2) 66 such as a chuck or a suction nozzle, and holds a component using the component holding tool 66. The work head moving device 64 includes an X-direction moving device 68, a Y-direction moving device 70, and a Z-direction moving device 72. The two work heads 60 and 62 are caused to move integrally to an arbitrary position on the frame section 40 by the X-direction moving device 68 and the Y-direction moving device 70. As illustrated in FIG. 2, the work heads 60 and 62 are mounted to be attachable and detachable in sliders 74 and 76, respectively, and the Z-direction moving device 72 causes the sliders 74 and 76 to move in the up-down direction individually in other words, the work heads 60 and 62 are caused to move in the up-down direction individually by the Z-direction moving device 72.

The imaging device 26 is attached to the slider 74 in a state of facing downward, and is caused to move in the X-direction, the Y-direction, and the Z-direction together with the work head 60. Accordingly, the imaging device 26 images an arbitrary position on the frame section 40. As illustrated in FIG. 1, the imaging device 28 is arranged between the substrate conveying and holding device 22 and the component supply device 30 on the frame section 40 in a state of facing upward. Accordingly, the imaging device 28 images the components which are held by the component holding tools 66 of the work heads 60 and 62.

The component supply device 30 is arranged on an end portion of one side in the front-rear direction of the frame section 40. The component supply device 30 includes a tray-type component supply device 78 and a feeder-type component supply device (not illustrated). The tray-type component supply device 78 is a device which supplies components which are in a state of being placed on a tray. The feeder-type component supply device is a device which supplies components using a tape feeder (not illustrated).

The bulk component supply device 32 is arranged on an end portion of the other side in the front-rear direction of the frame section 40. The bulk component supply device 32 is a device which orders multiple components in a state of being scattered loosely and supplies the components in an ordered state. In other words, a device which orders multiple components which are in arbitrary postures into predetermined postures, and supplies the components which are in the predetermined postures. Hereinafter, detailed description will be given of the configuration of the bulk component supply device 32. Examples of the components which are supplied by the component supply device 30 and the bulk component supply device 32 include electronic circuit components, constituent components of a solar cell, constituent components of a power module, and the like. Among the electronic circuit components, there are components which include leads, components which do not include leads, and the like.

Figure 3:
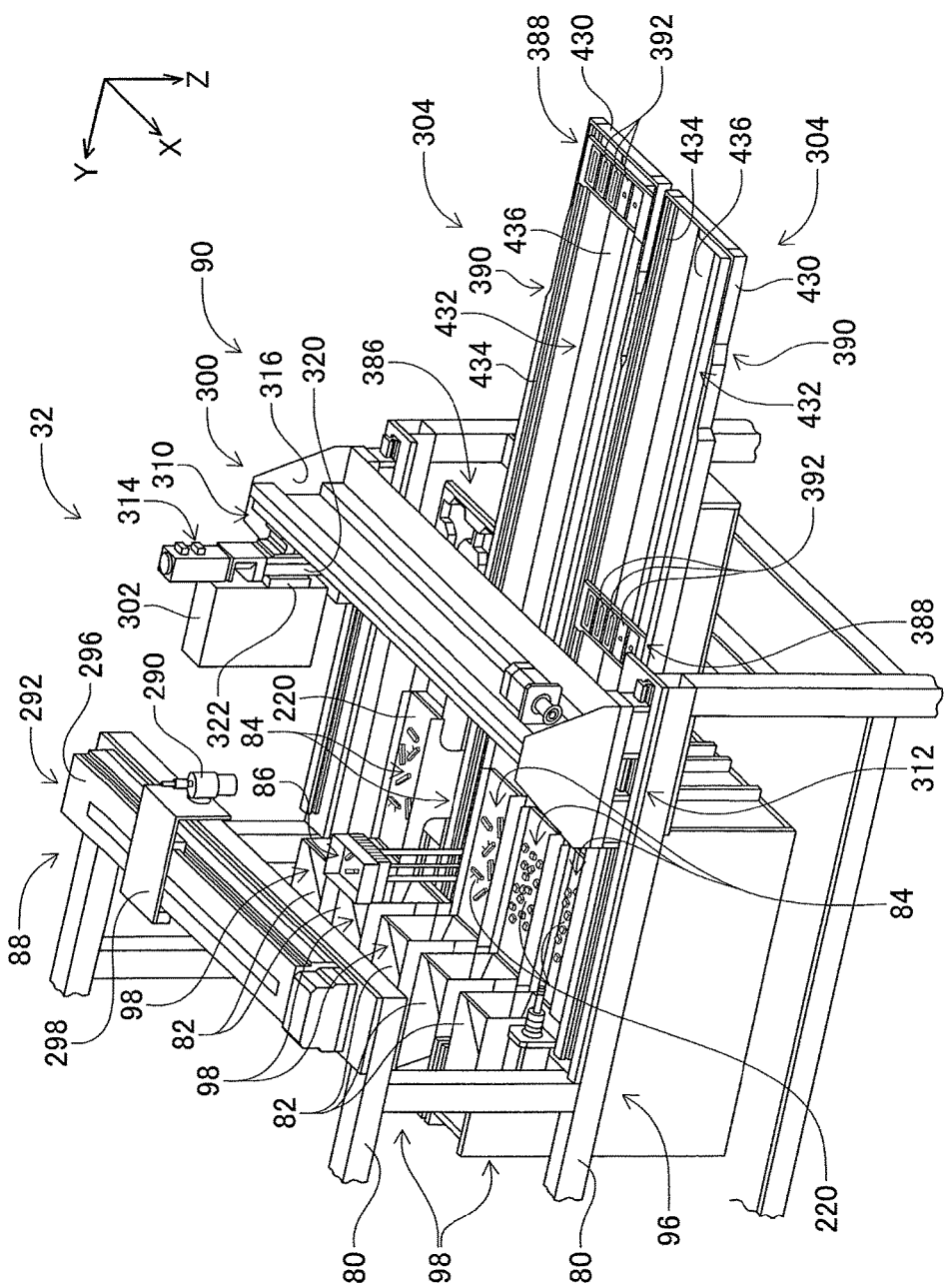
FIG. 3 is a perspective view illustrating a bulk component supply device.

As illustrated in FIG. 3, the bulk component supply device 32 includes a main body 80, a component feeder 82, a component scattered state realization device 84, a component returning device 86, an imaging device 88, and a component delivery device 90. The component feeder 82, the component scattered state realization device 84, and the component returning device 86 are assembled onto a frame 96 which is fixed to the main body 80, and a component supply unit 98 is formed by the component feeder 82, the component scattered state realization device 84, and the component returning device 86. Five of the component supply units 98 are arranged in the bulk component supply device 32, and the five component supply units 98 are arranged to line up in a single row in the X-direction. FIG. 3 is a view illustrating the internal structure of the bulk component supply device 32.

(a) Component Feeder

Figure 4:
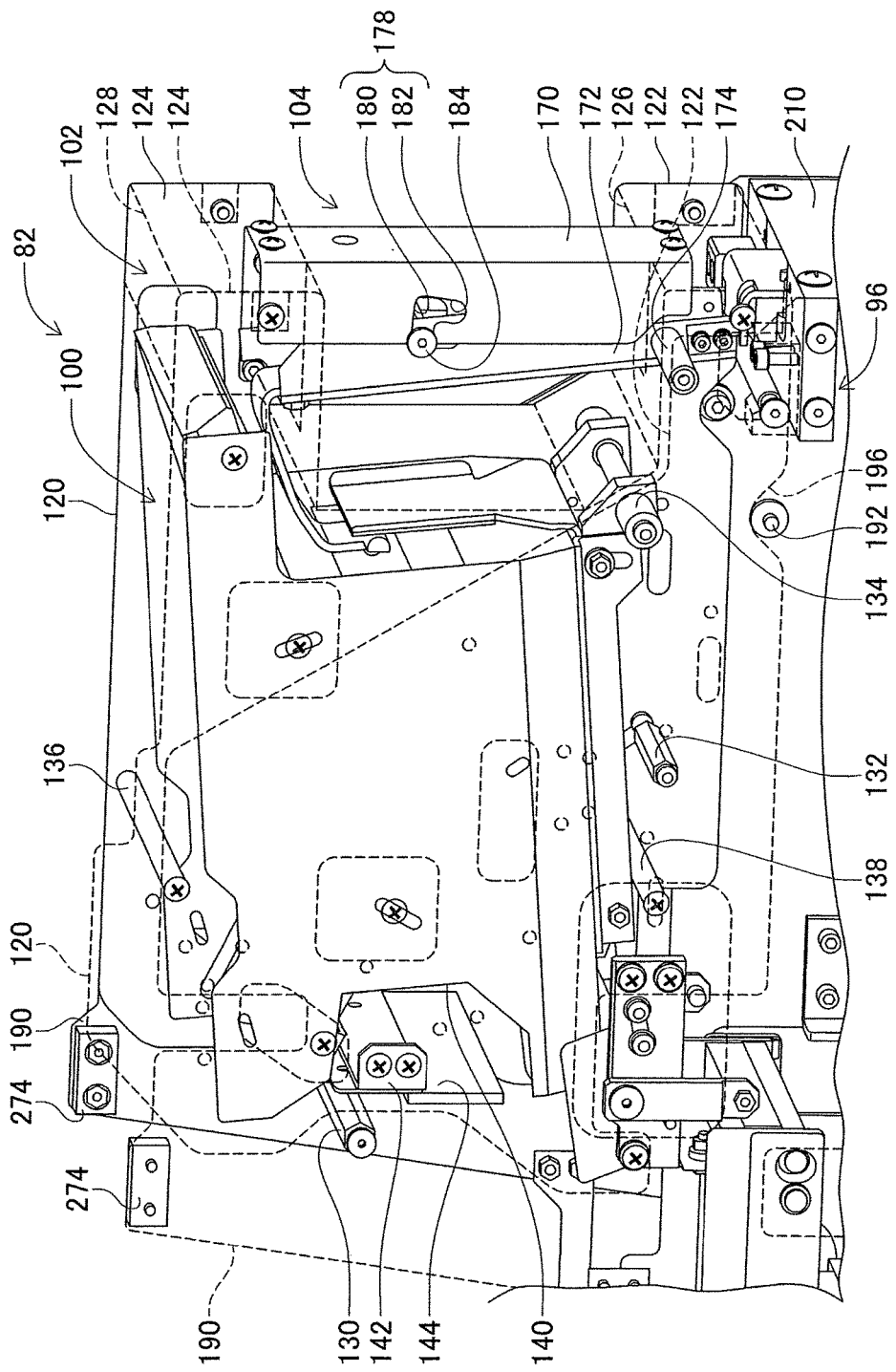
FIG. 4 is a perspective view illustrating a component feeder.
Figure 5:
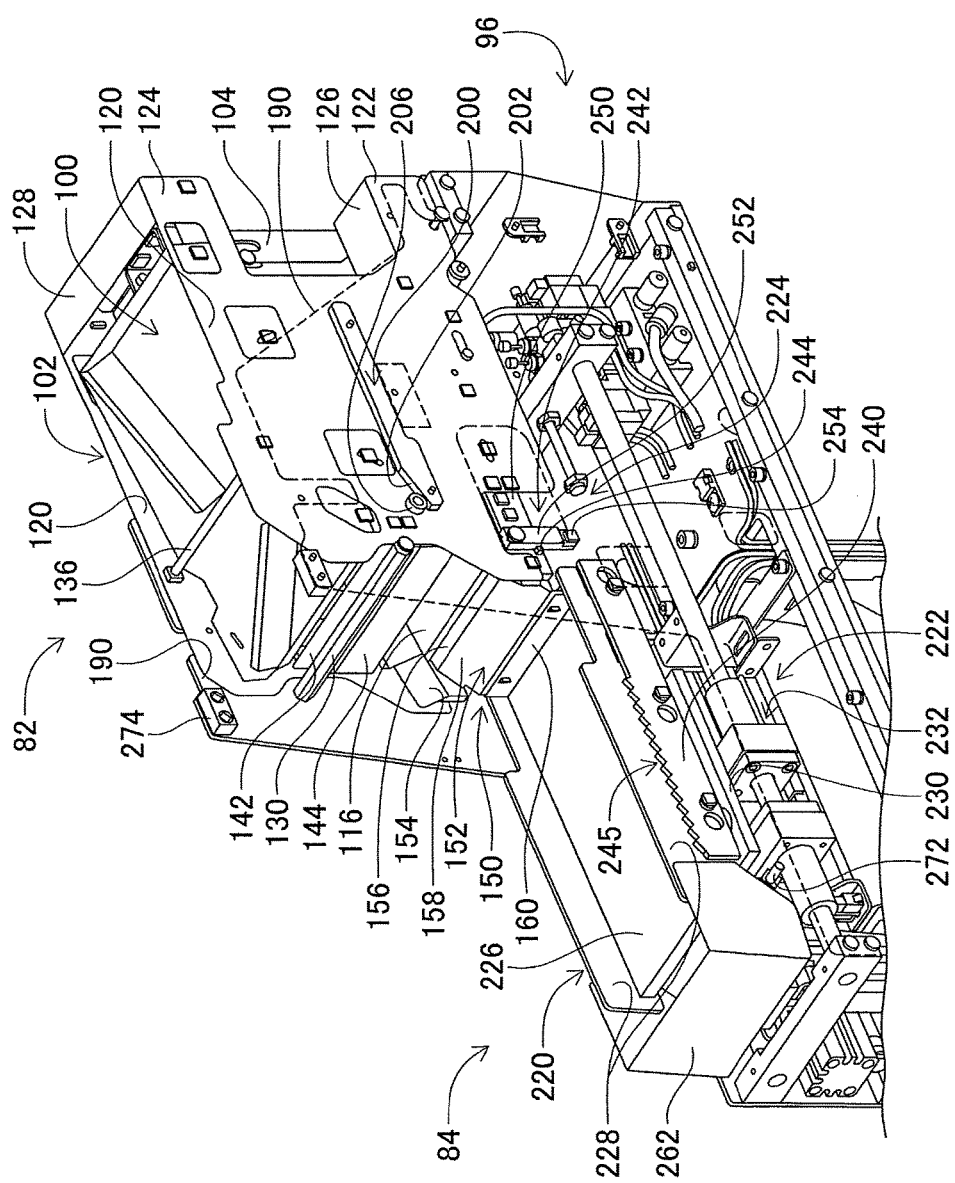
FIG. 5 is a perspective view illustrating a component supply unit.

As illustrated in FIGS. 4 and 5, the component feeder 82 includes a component storage device 100, a housing 102, and a grip 104.

(i) Component Storage Device

Figure 6:
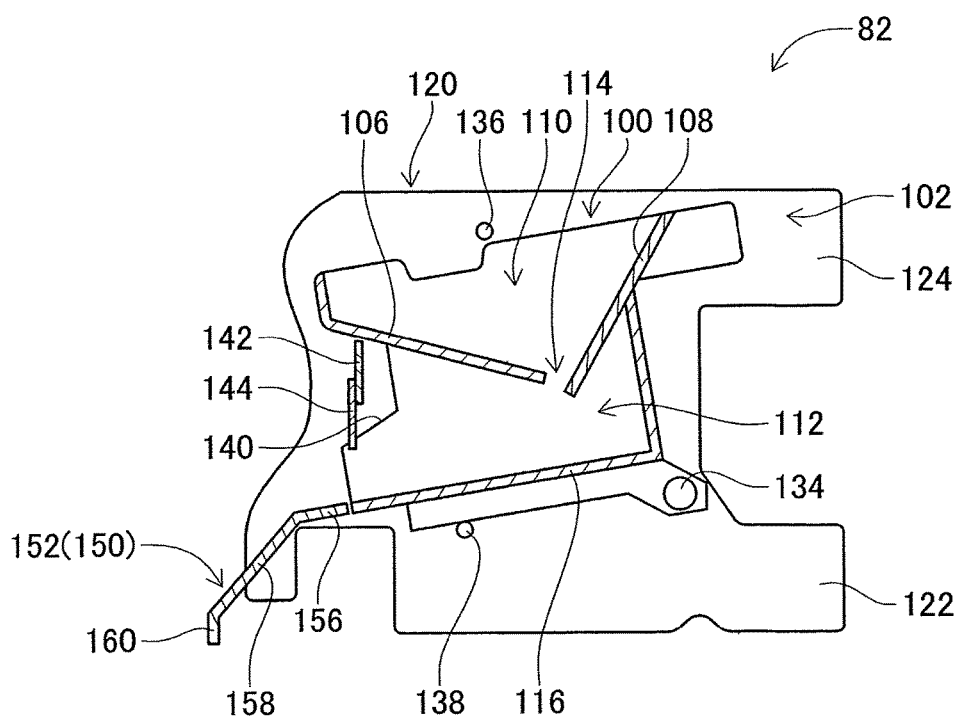
FIG. 6 is a sectional view illustrating the component feeder.

The component storage device 100 is substantially a rectangular parallelepiped shape, and an upper face and the front face are opened. As illustrated in FIG. 6, the inner portion of the component storage device 100 is divided into a charging section 110 and a storage section 112 by a pair of inclined surfaces 106 and 108. Specifically, the inclined surfaces 106 and 108 are arranged such that the end portions face each other, and the inclined surfaces 106 and 108 are inclined such that the end portions which face each other are positioned at the bottom. The end portions which face each other of the inclined surfaces 106 and 108 are separated, and an opening 114 is formed between the end portions which face each other of the inclined surfaces 106 and 108. The grade of an inclined surface 106 which is positioned at the front face side at which the component storage device 100 is open is gentler than the grade of the inclined surface 108, and the end portion of the opening 114 side of the inclined surface 106 is positioned above the end portion of the opening 114 side of the inclined surface 108. The opening 114 is opened to be larger than the components which are housed in the component storage device 100.

Due to this structure, when multiple components are charged into the charging section 110 from the open upper face of the component storage device 100, the multiple components roll on the inclined surfaces 106 and 108, are moved from the opening 114, and are stored in the storage section 112. A bottom face of the storage section 112, that is, the bottom face of the component storage device 100 is an inclined surface 116, and is inclined toward the open front face of the component storage device 100.

(ii) Housing

As illustrated in FIGS. 4 and 5, the housing 102 includes a pair of side walls 120. The pair of side walls 120 are substantially rectangular, and are arranged facing each other so as to interpose the component storage device 100. A pair of protruding portions 122 and 124 which protrude in a square-bracket shape are formed on the end portion of the rear side of each of the side walls 120. The pair of side walls 120 are joined by connecting members 126 and 128 on the protruding portions 122 and 124. The pair of side walls 120 are joined by a connecting rod 130 at the end portion of the front side, and are joined by a connecting rod 132 at the bottom end portion. The dimensions of the space between the pair of side walls 120 are slightly longer than the width of the component storage device 100 which is interposed between the pair of side walls 120.

A support shaft 134 is bridged across the pair of side walls 120 at a base end section of the protruding portion 122, and the component storage device 100 is supported, to be capable of rocking, by the support shaft 134 at a bottom end portion on the rear side. In other words, the component storage device 100 rocks centered on the support shaft 134 in the inner portion of the housing 102. A rod-shaped stopper 136 is bridged across the pair of side walls 120 at the top end portion, and a rod-shaped stopper 138 is bridged at the bottom end portion. Upward rocking of the component storage device 100 is restricted by the stopper 136, and downward rocking of the component storage device 100 is restricted by the stopper 138.

A cutout portion 140 is formed on the front side of the side wall of the component storage device 100, and a brush holding member 142 is bridged across the pair of side walls 120 so as to be positioned in the cutout portion 140. Accordingly, the component storage device 100 rocks in the inner portion of the housing 102 without coming into contact with the brush holding member 142. A brush 144 is fixed to the bottom end portion of the brush holding member 142 so as to extend downward. The brush 144 is formed in a plate shape, and the dimension in the width direction of the brush 144 which is formed in a plate shape is slightly smaller than the dimension in the width direction of the inner portion of the component storage device 100. Accordingly, when the component storage device 100 rocks upward, the brush 144 moves relatively toward the inner portion of the component storage device 100.

As illustrated in FIG. 5, a component discharge member 150 is arranged, in a fixed manner, between the pair of side walls 120 so as to be positioned in front of the bottom end portion of the front face of the component storage device 100. The component discharge member 150 includes an inclined plate 152, and a pair of side plates (note that only one of the pair of side plates is depicted in FIG. 5) 154 which are provided to stand at both end portions in the width direction of the inclined plate 152. The inclined plate 152 is formed by three different inclined surfaces. First, a first inclined surface 156 which is closest to the component storage device 100 is inclined in the same direction as the inclined surface 116 of the component storage device 100, and is inclined to the same extent as the inclined surface 116. A second inclined surface 158 which is continuous with the first inclined surface 156 is inclined in the same direction as the first inclined surface 156, and is inclined at a steeper angle than the first inclined surface 156. A third inclined surface 160 which is continuous with the second inclined surface 158 is inclined in the same direction as the second inclined surface 158, and is inclined substantially in the vertical direction.

(iii) Grip

As illustrated in FIG. 4, the grip 104 is formed by a fixed gripping member 170 and a movable gripping member 172. The fixed gripping member 170 has a rectangular tubular shape, and one side face is open. The fixed gripping member 170 is fixed to the connecting member 128 at the top end portion and is fixed to the connecting member 126 at the bottom end portion in a state in which the opening side face faces the space between the pair of side walls 120. The movable gripping member 172 also has a rectangular tubular shape, and one side face is open. The dimension in the width direction of the movable gripping member 172 is slightly smaller than the dimension in the width direction of the fixed gripping member 170. The movable gripping member 172 is fitted into the inner portion of the fixed gripping member 170 such that the side face on which the movable gripping member 172 is opened and the side face on which the fixed gripping member 170 is opened face each other.

A support shaft 174 is bridged across the pair of side walls 120 at the protruding portion 122, and the movable gripping member 172 is supported, to be capable of rocking, by the support shaft 174 at the bottom end portion. In other words, the movable gripping member 172 rocks around the bottom end portion, and the top end portion of the movable gripping member 172 approaches or separates from the fixed gripping member 170. The movable gripping member 172 is joined to the rear face of the component storage device 100 at the top end portion by a connecting arm 176. Therefore, the component storage device 100 also rocks together with the rocking of the movable gripping member 172. In other words, when the top end portion of the movable gripping member 172 rocks in a direction separating from the fixed gripping member 170, the component storage device 100 rocks downward. On the other hand, when the top end portion of the movable gripping member 172 rocks in a direction approaching the fixed gripping member 170, the component storage device 100 rocks upward.

A cutout portion 178 is formed on the side face of the fixed gripping member 170. The cutout portion 178 is formed of a first cutout portion 180 which is cut out in a substantially horizontal direction from the open side face of the fixed gripping member 170 toward the inside, and a second cutout portion 182 which is cut out downward from the end portion of the inner portion side of the first cutout portion 180. On the other hand, an engagement member 184 which engages with the cutout portion 178 is fixed to the side face of the movable gripping member 172. A spring (not illustrated) is arranged in a compressed state between the fixed gripping member 170 and the movable gripping member 172. Therefore, the movable gripping member 172 is biased in a direction separating from the fixed gripping member 170 by the elastic force of the spring. In this case, the engagement member 184 of the movable gripping member 172 is engaged with the first cutout portion 180 of the cutout portion 178.

In other words, in a normal state, the movable gripping member 172 is biased in a direction separating from the fixed gripping member 170, and the top end portion of the movable gripping member 172 rocks in a direction separating from the fixed gripping member 170. The component storage device 100 rocks downward, and as illustrated in FIG. 6, the component storage device 100 comes into contact with the stopper 138. In this case, the end portion of the front side of the inclined surface 116 of the component storage device 100 faces the end portion of the rear side of the first inclined surface 156 of the inclined plate 152 with almost no gap therebetween. When the component storage device 100 rocks downward, since the brush 144 does not move relatively toward the inner portion of the component storage device 100, there is a large opening between the bottom end portion of the brush 144 and the inclined surface 116 of the component storage device 100. Therefore, in a normal state, the components which are stored in the storage section 112 of the component storage device 100 roll out onto the upper face of the inclined plate 152.

The component feeder 82 is attached to the frame 96 to be attachable and detachable. Specifically, as illustrated in FIG. 4, the frame 96 includes a pair of side frame sections 190. The pair of side frame sections 190 are substantially plate shaped, and are arranged to face each other in a state of being separated by a predetermined distance. The distance between the pair of side frame sections 190 is slightly longer than the dimension of the width direction of the component feeder 82, that is, slightly longer than the distance between the pair of side walls 120. Therefore, the component feeder 82 is inserted between the pair of side frame sections 190.

An engaging pin 192 which protrudes toward the inner portion of the frame 96 is fixed to the inner wall surface of each of the side frame sections 190. On the other hand, a cutout portion 196 is formed in a lower edge of each of the side walls 120 of the component feeder 82. As illustrated in FIG. 5, a support member 200 of a longitudinal shape is fixed to the inner wall surface of each of the side frame sections 190 so as to extend in the front-rear direction. An inclined surface 202 which is inclined downward toward the front is formed on the end portion of the front side of the support member 200. On the other hand, an engaging pin 206 is formed on the outer wall surface of each of the side walls 120 of the component feeder 82. When the component feeder 82 is inserted between the pair of side frame sections 190, the engaging pin 192 engages with the cutout portion 196, and the engaging pin 206 is supported on the inclined surface 202 of the support member 200. Accordingly, the component feeder 82 is positioned between the pair of side frame sections 190.

Figure 7:
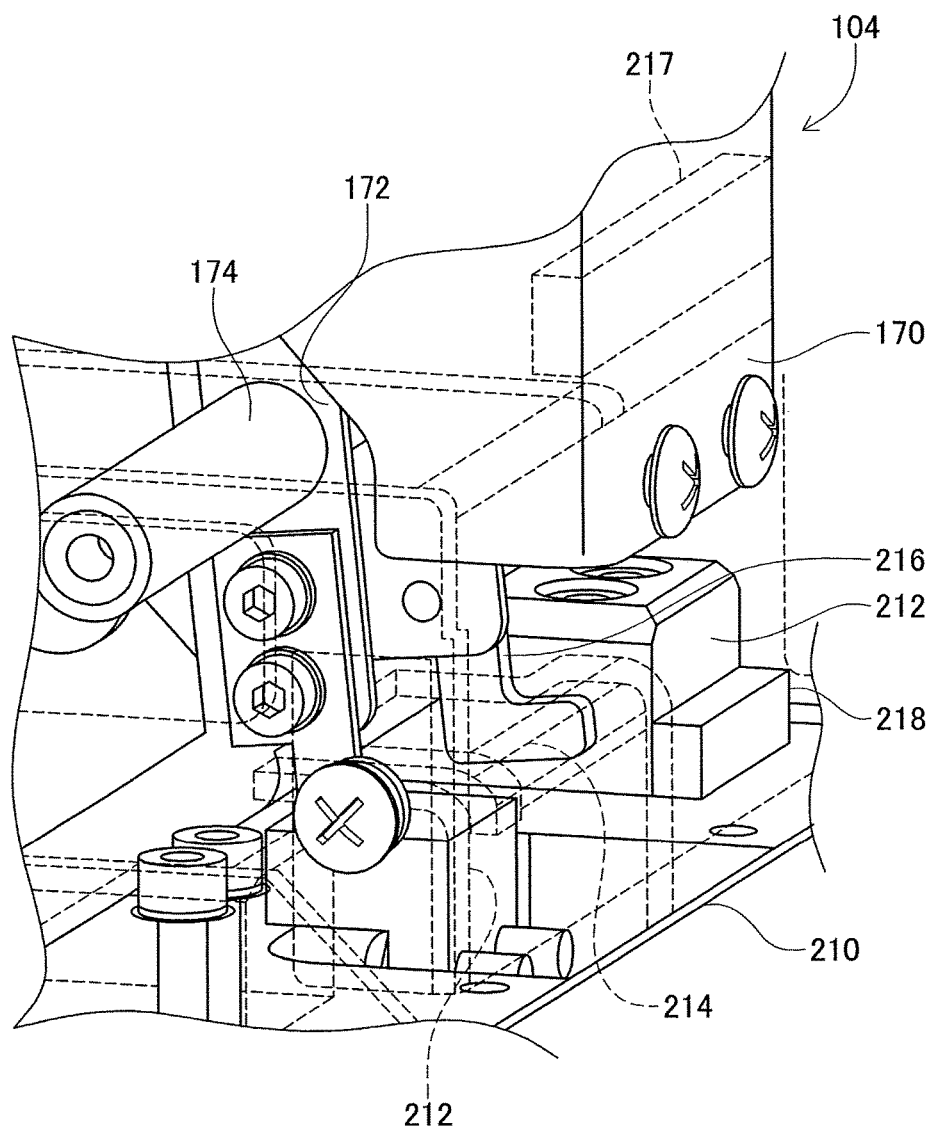
FIG. 7 is an enlarged view illustrating a bottom end portion of a grip of the component feeder.

As illustrated in FIG. 4, a frame main body section 210 is arranged under the connecting member 126 of the component feeder 82 which is positioned between the pair of side frame sections 190. As illustrated in FIG. 7, a pair of support blocks 212 are fixed to the upper face of the frame main body section 210 to line up in the width direction of the frame 96. An engagement rod 214 is bridged across the pair of support blocks 212. A claw member 216 is fixed to the bottom end portion of the movable gripping member 172 of the grip 104 of the component feeder 82. The claw member 216 is substantially L shaped, and a bent distal end portion extends toward the engagement rod 214. In a state in which the movable gripping member 172 is biased in a direction separating from the fixed gripping member 170 by the elastic force of the spring, that is, in a normal state, the distal end portion of the claw member 216 is engaged with the engagement rod 214. Accordingly, the component feeder 82 is locked to the frame 96 in a state of being positioned between the pair of side frame sections 190.

In a case in which the operator grips the grip 104 of the component feeder 82, the movable gripping member 172 approaches the fixed gripping member 170 against the elastic force of the spring. In this case, the claw member 216 which is fixed to the bottom end portion of the movable gripping member 172 rocks in a direction separating from the engagement rod 214. Accordingly, the engagement of the claw member 216 to the engagement rod 214 is released. Therefore, by lifting the component feeder 82 in a state in which the operator is gripping the grip 104 of the component feeder 82, the component feeder 82 is removed from the frame 96.

An RFID (short for radio frequency identifier) 217 is arranged on the inside of the bottom end portion of the fixed gripping member 170 of the grip 104. The RFID 217 transmits ID information by short-range wireless communication using radio waves, and information relating to the components which are supplied by the component feeder 82 is transmitted as the ID information. On the other hand, a receiver 218 which is capable of receiving the ID information which is transmitted from the RFID 217 is arranged on the upper face of the frame main body section 210. Accordingly, in the bulk component supply device 32, in a case in which the component feeder 82 is attached to the frame 96, the ID information is received by the receiver 218, and the components which are supplied from the component feeder 82 are collated based on the ID information.

(b) Component Scattered State Realization Device

As illustrated in FIG. 5, the component scattered state realization device 84 includes a component support member 220, a component support member moving device 222, and a feeder vibration device 224. The component support member 220 includes a component support section 226 and a pair of leg sections 228. The component support section 226 is substantially in the form of a longitudinal plate and is arranged so as to extend forward from under the inclined plate 152 of the component feeder 82. The pair of leg sections 228 also have a plate shape and face each other in a state of being fixed to both side edges of the component support section 226 in the longitudinal direction. Each of the leg sections 228 is fixed to a side edge in the longitudinal direction of the component support section 226 so as to protrude in the up-down direction of the component support section 226.

Figure 8:
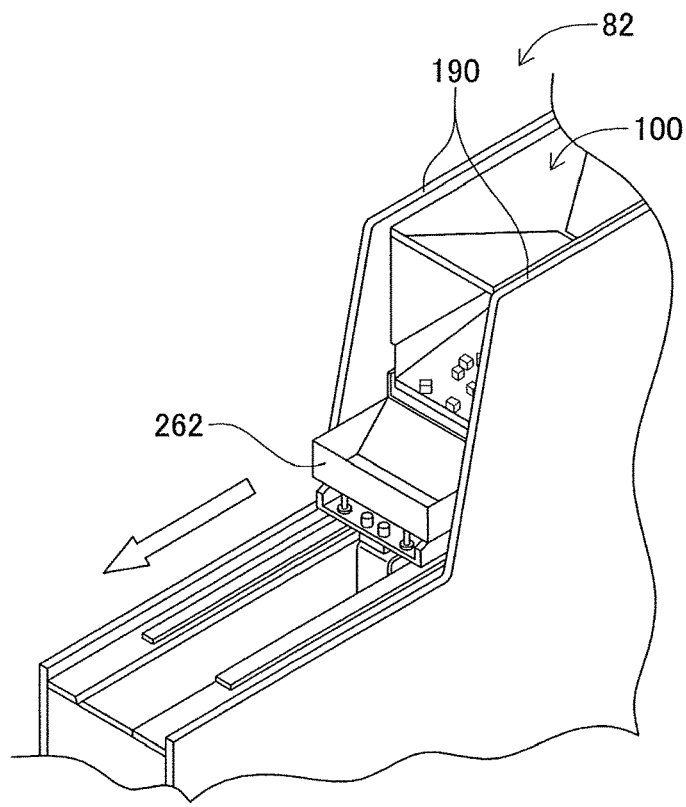
FIG. 8 is a perspective view illustrating the component supply unit in a state in which a component support member is moved to a retraction position.

The component support member moving device 222 includes a slider 230 and a slide mechanism 232. The slider 230 is fixed to the bottom end portion of the leg sections 228 of the component support member 220. The slide mechanism 232 is a mechanism which causes the slider 230 to move in the front-rear direction through the driving of an electromagnetic motor (not illustrated). Accordingly, the component support member 220 moves in the front-rear direction in a state in which the upper face of the component support section 226 is horizontal, slightly below the bottom end of the inclined plate 152 of the component feeder 82. As illustrated in FIG. 5, the component support member 220 moves between a component supply position at which substantially the entirety of the component support section 226 is exposed and a retraction position at which the entirety of the component support section 226 is positioned below the component feeder 82 as illustrated in FIG. 8.

Figure 9:
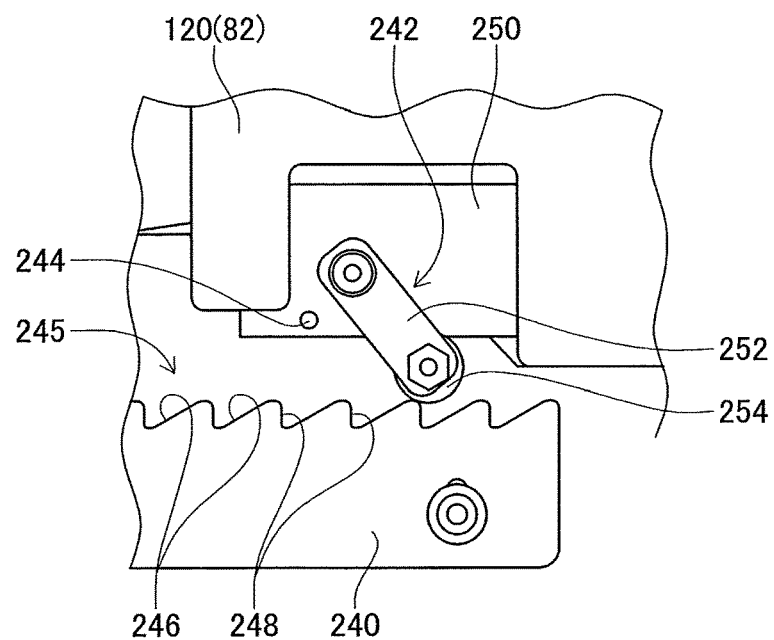
FIG. 9 is an enlarged view of a cam member and a cam follower.

As illustrated in FIG. 5, the feeder vibration device 224 includes a cam member 240, a cam follower 242, and a stopper 244. The cam member 240 is plate shaped, and is fixed to the side face of the outside of the leg section 228 so as to extend in the front-rear direction. Multiple teeth 245 are formed at an equal interval in the front-rear direction on the top end portion of the cam member 240. As illustrated in FIG. 9, each of the multiple teeth 245 is defined by an inclined surface 246 which faces upward toward the rear, and a vertical surface 248 which extends downward in the vertical direction from the top end of the inclined surface 246.

The cam follower 242 includes a bracket 250, a lever 252, and a roller 254. The bracket 250 is fixed to the bottom end portion of the front side of the side wall 120 of the component feeder 82. The lever 252 is arranged to extend in the up-down direction, and is held by the bracket 250 at the top end portion so as to be capable of rocking around an axial line which is parallel to the width direction of the component feeder 82. The roller 254 is held by the bottom end portion of the lever 252 so as to be capable of rotating around an axial line which is parallel to the width direction of the component feeder 82. The lever 252 is biased to a direction toward the front by an elastic force of a coil spring (not illustrated).

The stopper 244 is provided to protrude from the bracket 250, and the lever 252 which is biased by the elastic force of the coil spring is in contact with the stopper 244. In other words, the stopper 244 restricts the rocking of the lever 252 to the front side. The lever 252 is in a posture in which the lever 252 extends downward in the vertical direction in a state in which the forward rocking is restricted.

(c) Component Returning Device

Figure 10:
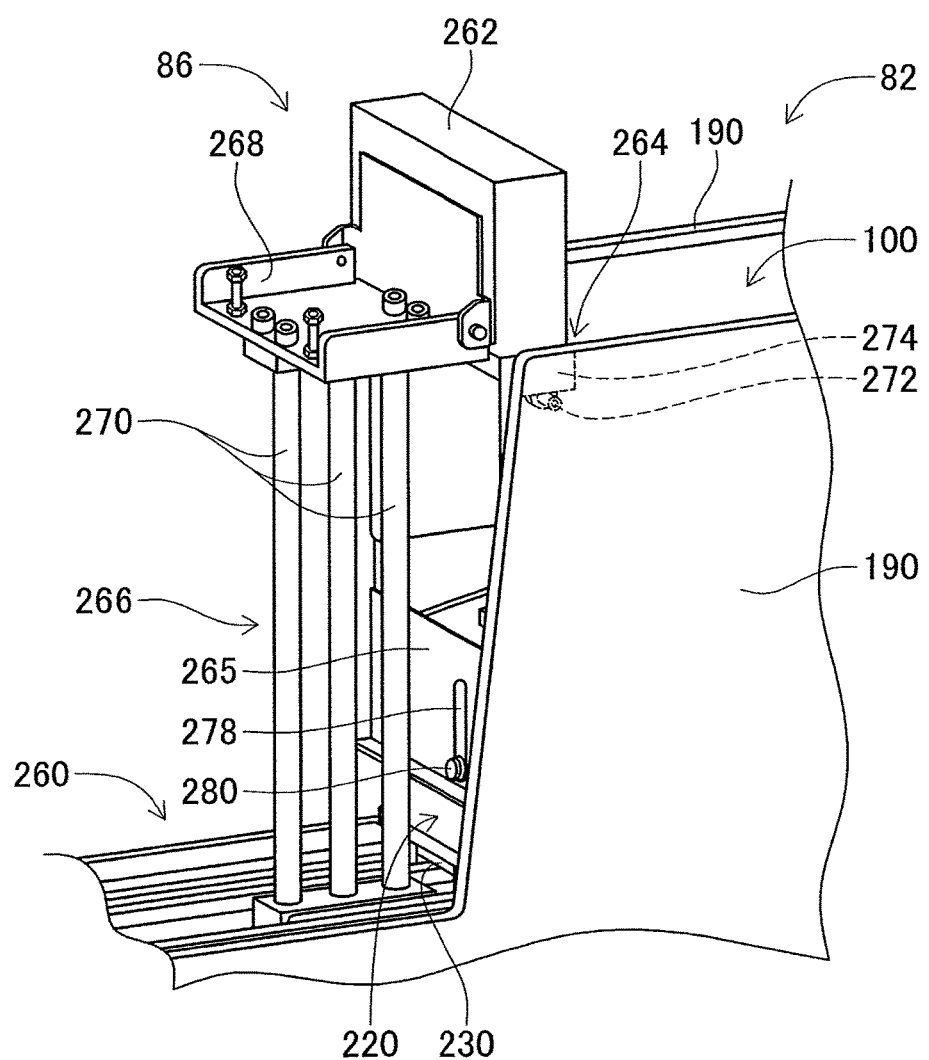
FIG. 10 is a perspective view illustrating the component supply unit in a state in which a component collecting container is lifted to a lifting end position.
Figure 11:
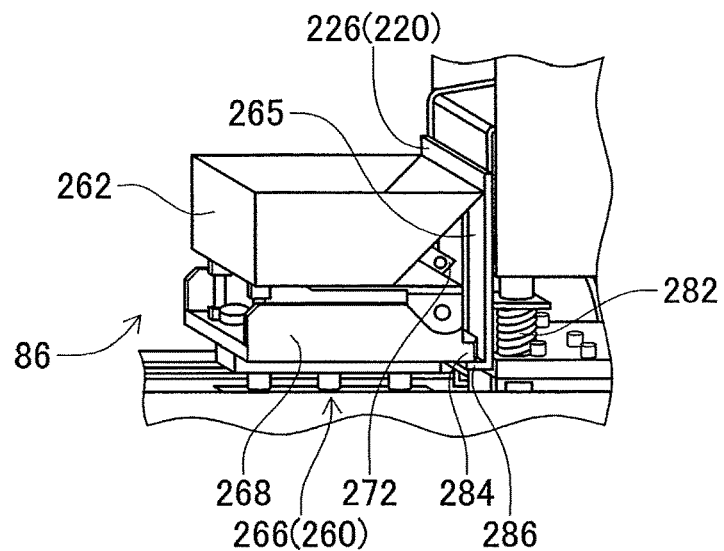
FIG. 11 is a perspective view illustrating a component returning device in a state in which the component collecting container is lowered to a lowering end position.

As illustrated in FIG. 10, the component returning device 86 includes a container lifting and lowering device 260, a component collecting container 262, a motion conversion mechanism 264, and a shutter 265. The container lifting and lowering device 260 includes an air cylinder 266 and a lifting and lowering member 268. The air cylinder 266 includes a piston rod 270, and is provided on the front side of the component support member 220 such that the piston rod 270 expands and contracts in the up-down direction. The air cylinder 266 is fixed to the end portion of the front side of the slider 230. Accordingly, the air cylinder 266 moves in the front-rear direction together with the component support member 220 through the operation of the component support member moving device 222. The lifting and lowering member 268 is fixed to the distal end portion of the piston rod 270, and the component collecting container 262 is arranged on the upper face of the lifting and lowering member 268. Accordingly, the component collecting container 262 moves in the up-down direction through the operation of the air cylinder 266. In this case, the component collecting container 262 moves between the lifting end position which is positioned higher than the component feeder 82, as illustrated in FIG. 10, and the lowering end position which is positioned lower than the component support section 226 of the component support member 220, as illustrated in FIG. 11.

The component collecting container 262 has a box-like shape with an opened upper face, and is held to be capable of rotating around an axial line which is parallel to the width direction of the component feeder 82 on the upper face of the lifting and lowering member 268. Accordingly, the bottom face of the component collecting container 262 becomes horizontal, and the component collecting container 262 pivots between a component receiving posture (the posture of the component collecting container 262 in FIG. 11) in which the components may be received from the opening, and a component discharge posture (the posture of the component collecting container 262 in FIG. 10) in which the bottom face of the component collecting container 262 becomes vertical and it is possible to discharge the components from the opening. The component collecting container 262 is biased in a direction in which the component collecting container 262 assumes the component receiving posture by a coil spring (not illustrated). Accordingly, in a normal state, the component collecting container 262 is supported in the component receiving posture. The rear wall of the component collecting container 262 is an inclined wall which goes downward to the rear in the component discharge posture.

As illustrated in FIG. 5, the motion conversion mechanism 264 includes a protruding pin 272 and an engaging block 274. The protruding pin 272 is arranged at end portion of the rear side of the component collecting container 262 in the component receiving posture, and protrudes toward the outside at the side of the component collecting container 262. On the other hand, the engaging block 274 is fixed to the inside of the top end portion on the front side of the side frame section 190. As illustrated in FIG. 10, the protruding pin 272 is engaged with the engaging block 274 when the component collecting container 262 is lifted to the lifting end position through the operation of the air cylinder 266. Accordingly, the component collecting container 262 pivots and assumes the component discharge posture.

The shutter 265 is substantially plate shaped, and the dimension in the width direction thereof is approximately the same as the dimension in the width direction of the component support member 220. A long hole 278 is formed in the shutter 265 so as to extend in the up-down direction, and a protruding section 280 which is fixed to the end portion on the front side of the slider 230 is inserted into the long hole 278 in a state in which there is a clearance. Accordingly, the shutter 265 slides in a direction along the long hole 278, that is, in the up-down direction between the component support member 220 and the component returning device 86. The shutter 265 is biased upward by a coil spring 282.

Figure 12:
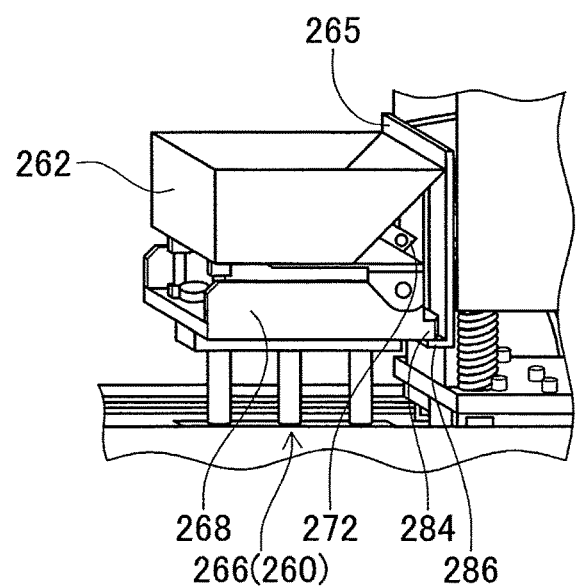
FIG. 12 is a perspective view illustrating the component returning device in a state in which the component collecting container is lifted from the lowering end position.
Figure 13:
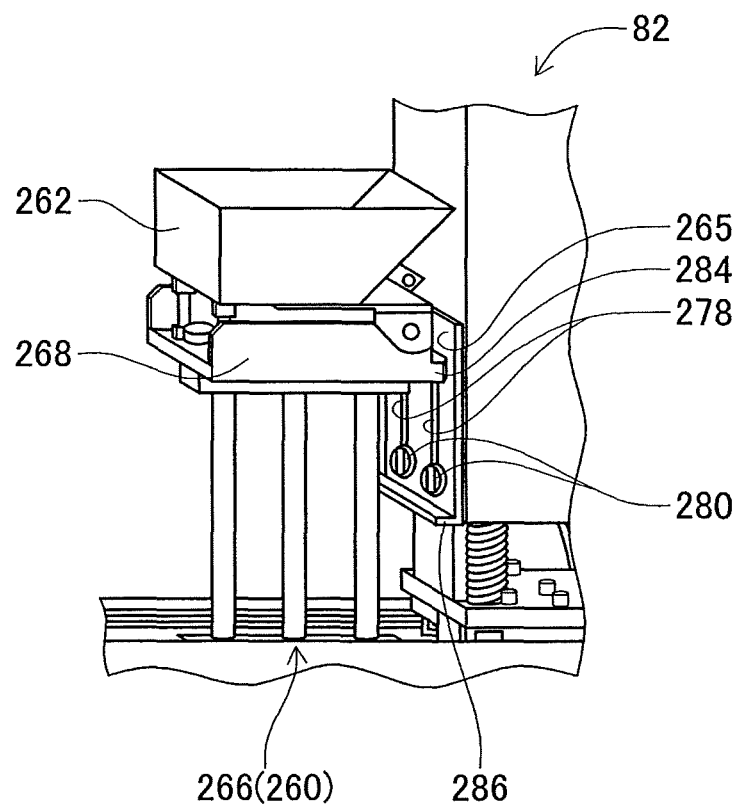
FIG. 13 is a perspective view illustrating the component returning device in a state in which the component collecting container is further lifted from the lowering end position.

As illustrated in FIG. 11, a protruding portion 284 which protrudes toward the rear is formed at the end portion on the rear side of the lifting and lowering member 268. On the other hand, a bent portion 286 which is bent toward the front is formed at the bottom end portion of the shutter 265. In a state in which the component collecting container 262 is lowered to the lowering end position, the protruding portion 284 of the lifting and lowering member 263 is engaged with the bent portion 286 of the shutter 265 from above. Accordingly, the shutter 265 is prevented from moving upward by the coil spring 282. The top end of the shutter 265 at this time is positioned below the component support section 226 of the component support member 220. As illustrated in FIG. 12, when the component collecting container 262 is lifted through the operation of the air cylinder 266, the lifting and lowering member 268 is also lifted. In this case, the shutter 265 is lifted together with the lifting and lowering member 268 due to the elastic force of the coil spring 282. When the component collecting container 262 is lifted through the operation of the air cylinder 266 and the lifting and lowering member 268 is also lifted, the shutter 265 is also lifted, and as illustrated in FIG. 13, the lifting of the shutter 265 is restricted due to the protruding section 280 coming into contact with the bottom end portion of the long hole 278. The top end of the shutter 265 which is in a state in which the lifting is restricted is positioned above the inclined plate 152 of the component feeder 82.

(d) Imaging Device

As illustrated in FIG. 3, the imaging device 88 includes a camera 290 and a camera moving device 292. The camera moving device 292 includes a guide rail 296, a slider 298, an electromagnetic motor (not illustrated). The guide rail 296 is fixed to the main body 80 so as to extend in the width direction of the bulk component supply device 32 above the component feeder 82. The slider 298 is attached to the guide rail 296 to be capable of sliding along the guide rail 296, and slides to an arbitrary position through the operation of the electromagnetic motor. The camera 290 is mounted to the slider 298 in a state of facing downward. The component support member 220 which is in the component supply position is positioned under the camera 290 which is mounted to the slider 298. Accordingly, the camera 290 moves over the component support member 220 of an arbitrary component supply unit 98 among the five component supply units 98, and images the multiple components on the component support section 226 of the component support member 220.

(e) Component Delivery Device

Figure 14:
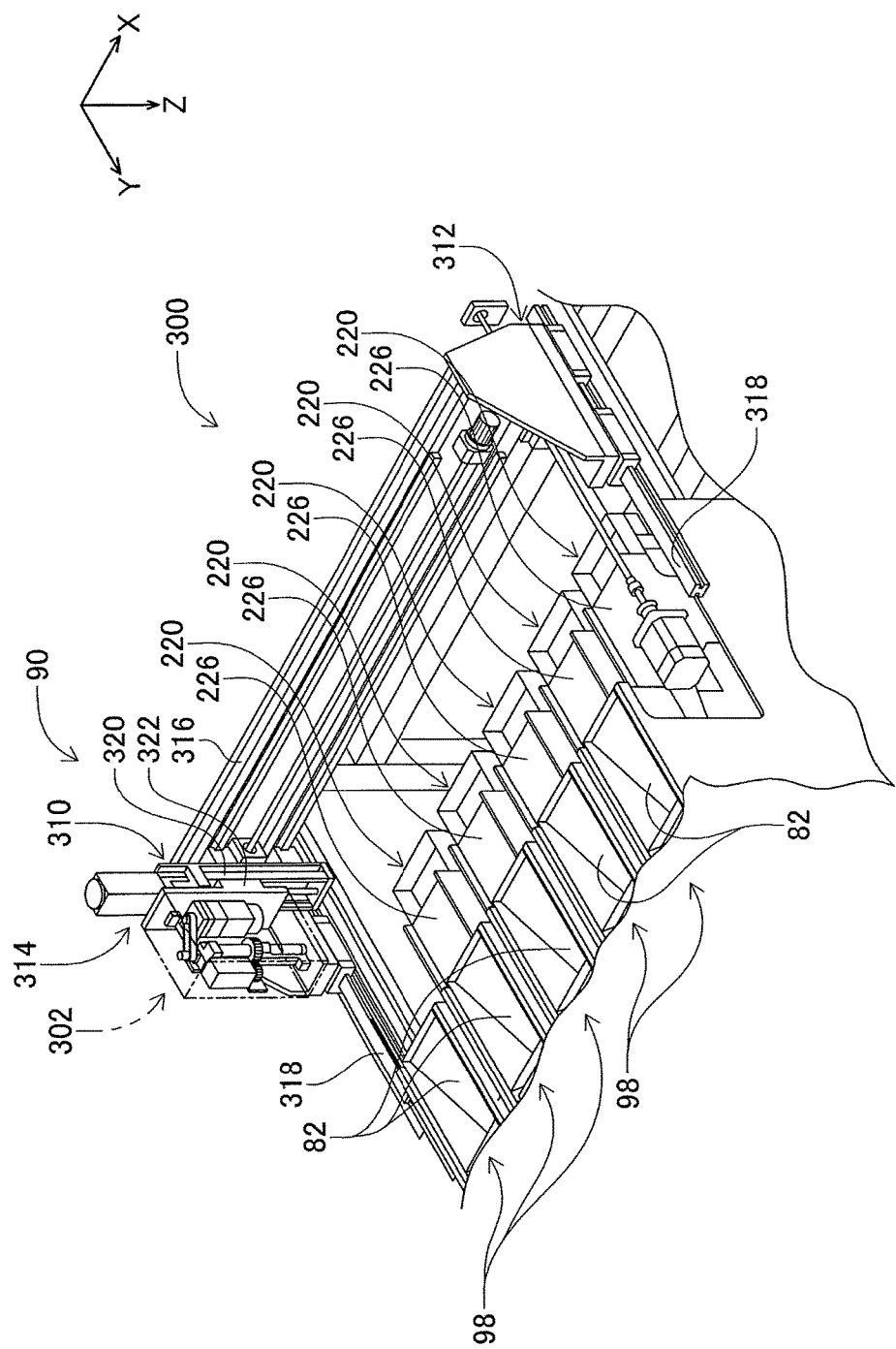
FIG. 14 is a perspective view illustrating a component delivery device.

As illustrated in FIGS. 3 and 14, the component delivery device 90 includes a component holding head moving device 300, a component holding head 302, and two shuttle devices 304.

(i) Component Holding Head Moving Device

The component holding head moving device 300 includes an X-direction moving device 310, a Y-direction moving device 312, and a Z-direction moving device 314. The Y-direction moving device 312 includes a Y slider 316, a pair of guide rails 318, and an electromagnetic motor (not illustrated). The pair of guide rails 318 are provided on the main body 80 so as to extend in the Y-direction to interpose the five component supply units 98. The Y slider 316 is supported to be capable of sliding in the Y-direction by the pair of guide rails 318 at both end portions, and moves to an arbitrary position in the Y-direction through the driving of the electromagnetic motor. The X-direction moving device 310 includes an X slider 320 and an electromagnetic motor (not illustrated). The X slider 320 is held to be capable of sliding in the X-direction on the side face of the Y slider 316, and moves to an arbitrary position in the X-direction through the driving of the electromagnetic motor. The Z-direction moving device 314 includes a Z slider 322 and an electromagnetic motor (not illustrated). The Z slider 322 is held to be capable of sliding in the Z-direction on the side face of the X slider 320, and moves to an arbitrary position in the Z-direction through the driving of the electromagnetic motor.

The component holding head 302 is mounted to the Z slider 322. Accordingly, through the operation of the component holding head moving device 300, the component holding head 302 is capable of moving in the up-down direction in addition to moving to an arbitrary position in the horizontal direction above the component support member 220 of the five component supply units 98. Therefore, the component holding head 302 is capable of moving between a holding position at which it is possible to hold the components from the component support member 220 of an arbitrary component supply unit 98 of the five component supply units 98, and a retraction position which is retracted from the holding position. The movement range of the component holding head 302 in the up-down direction due to the component holding head moving device 300 is between the upper face of the component support section 226 of the component support member 220 and the imaging device 88. In other words, the movement range of the component holding head 302 due to the component holding head moving device 300 is different from the movement range of the camera 290 due to the camera moving device 292. Therefore, it is possible to cause the camera 290 of the imaging device 88 and the component holding head 302 to move at the same time above the component support member 220 of the same component supply unit 98 among the five component supply units 98.

(ii) Component Holding Head

Figure 15:
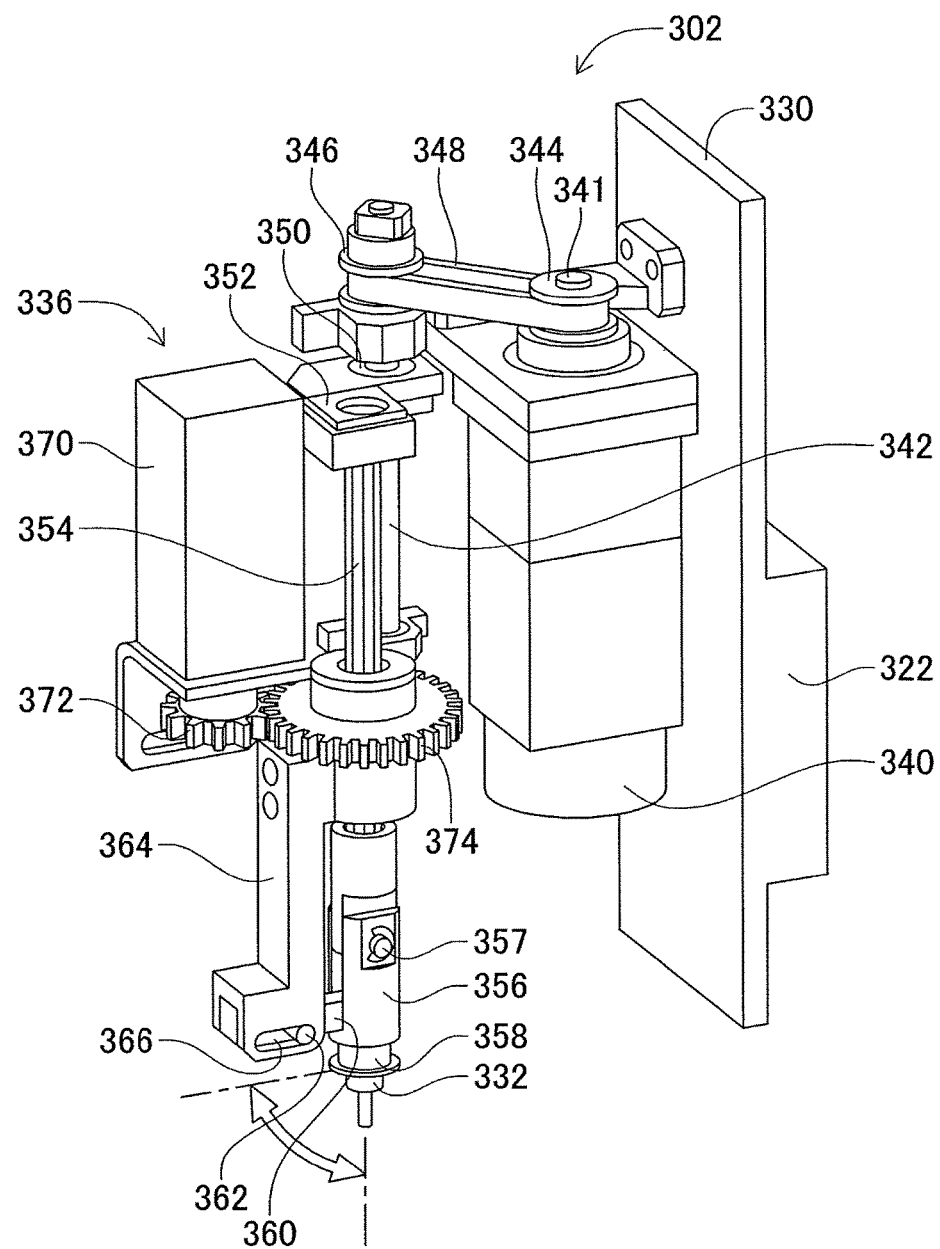
FIG. 15 is a perspective view illustrating a component holding head in a state in which a suction nozzle is positioned at a non-pivoting position.

As illustrated in FIG. 15, the component holding head 302 includes a head main body 330, a suction nozzle 332, a nozzle pivoting device 334, a nozzle rotation device 336, and a nozzle attachment device (refer to FIG. 17) 338. The head main body 330 is formed integrally with the Z slider 322. The nozzle pivoting device 334 is a device which causes the suction nozzle 332 to pivot. Specifically, an electromagnetic motor 340 is fixed to the head main body 330 such that an output shaft 341 of the electromagnetic motor 340 extends in the up-down direction. A screw rod 342 is arranged to extend in the up-down direction so as to be capable of rotating around an axial line. The rotational force of the electromagnetic motor 340 is transmitted to the screw rod 342 via timing pulleys 344 and 346 and a timing belt 348. A nut 350 is engaged with the screw rod 342, and a slider 352 is fixed to the nut 350. Accordingly, the slider 352 slides in the up-down direction through the rotation of the screw rod 342, that is, the driving of the electromagnetic motor 340.

A spline shaft 354 is fixed to the slider 352 so as to protrude downward, and a lever 356 is attached to the bottom end portion of the spline shaft 354 at one end portion so as to be capable of rotating around a horizontal axial line due to a shaft 357. A nozzle holding member 358 is fixed to the other end portion of the lever 356, and the suction nozzle 332 is held by the nozzle holding member 358. An arm 360 which protrudes in a direction which perpendicularly intersects a rotational axial line of the lever 356 is fixed to the side face of the lever 356. A roller 362 is attached to the tip portion side of the arm 360, and the roller 362 is capable of rotating around an axial line which is parallel to the rotational axial line of the lever 356. A cam member 364 is fixed to the head main body 330, and a long hole 366 which extends in the horizontal direction is formed in the cam member 364. A roller 362 which functions as a cam follower is engaged with the long hole 366, and moves along the long hole 366.

Figure 16:
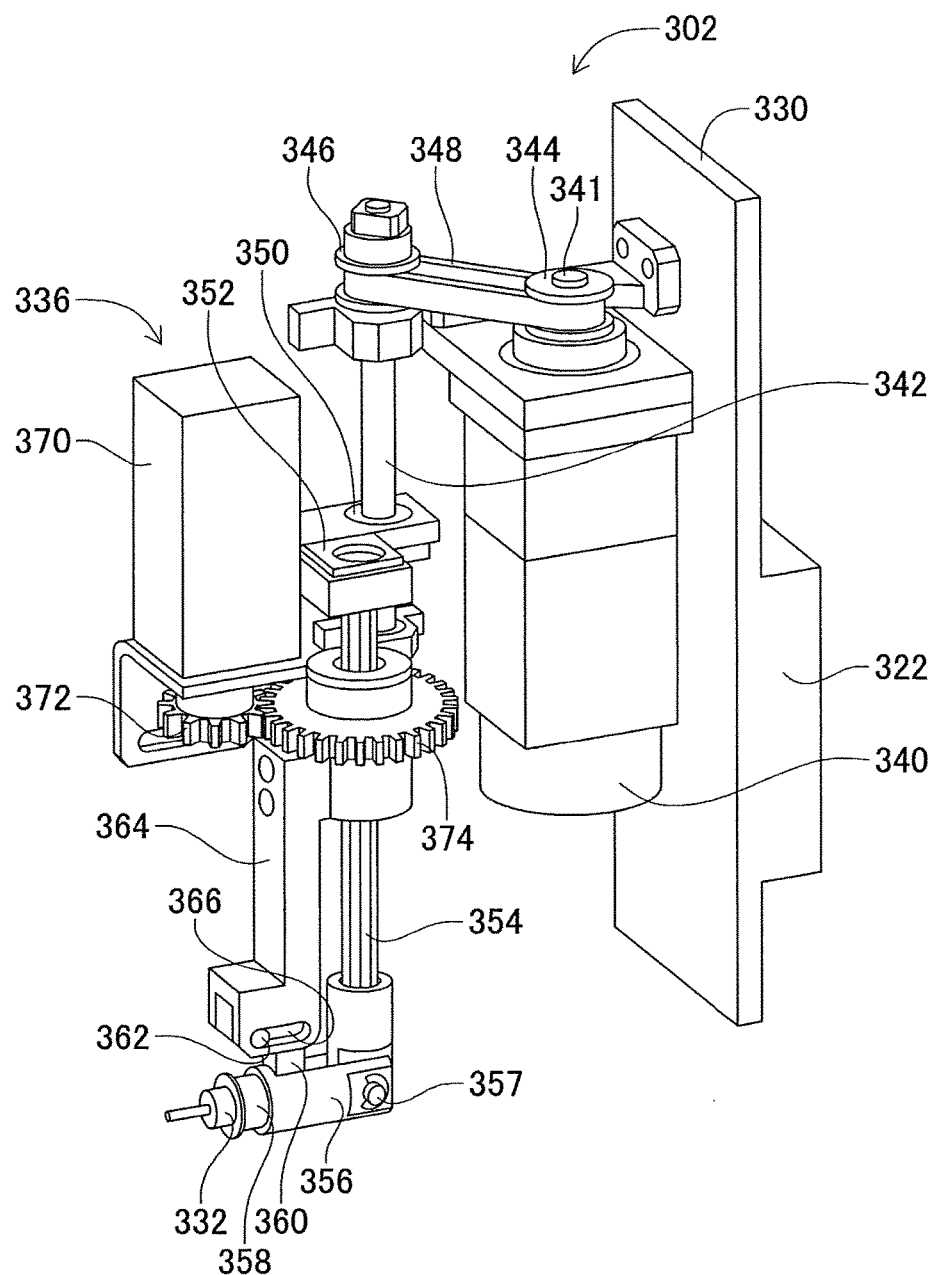
FIG. 16 is a perspective view illustrating the component holding head in a state in which the suction nozzle is positioned at a pivoting position.

According to this structure, when the slider 352 slides to a lifting end position, as illustrated in FIG. 15, the spline shaft 354 and the lever 356 are positioned on the same axis, and the suction nozzle 332 is positioned in the non-pivoting position without pivoting. When the slider 352 is lowered through the driving of the electromagnetic motor 340, the roller 362 moves in a direction which separates from the spline shaft 354 inside the long hole 366. Accordingly, the lever 356 rotates around the shaft 357, and the suction nozzle 332 pivots. In this case, when the slider 352 slides to the lowering end position, as illustrated in FIG. 16, the suction nozzle 332 pivots by 90° together with the lever 356 and is positioned at the pivoting position. In this manner, the suction nozzle 332 pivots between the non-pivoting position and the pivoting position through the driving of the electromagnetic motor 340.

The nozzle rotation device 336 is a device which causes the suction nozzle 332 to rotate around the axis of the suction nozzle 332. Specifically, an electromagnetic motor 370 is fixed to the head main body 330 such that the output shaft (not illustrated) of the electromagnetic motor 370 extends in the up-down direction, and a gear 372 is attached to the output shaft of the electromagnetic motor 370. A gear 374 which is capable of relative movement in the axial line direction of the spline shaft 354 but is not capable of relative rotation is engaged with the spline shaft 354. The gear 372 is engaged with the gear 374. Accordingly, the spline shaft 354 rotates around the axis through the driving of the electromagnetic motor 370. Since the spline shaft 354 and the gear 374 are capable of relative movement in the axial line direction of the spline shaft 354, even if the spline shaft 354 moves in the up-down direction during the pivoting of the suction nozzle 332, the rotational force of the electromagnetic motor 370 is transmitted to the spline shaft 354. A transmission mechanism (not illustrated) which transmits the rotational force of the spline shaft 354 to the suction nozzle 332 is embedded in the inner portion of the lever 356, and the suction nozzle 332 rotates around the axis of the suction nozzle 332 together with the rotation of the spline shaft 354.

Figure 17:
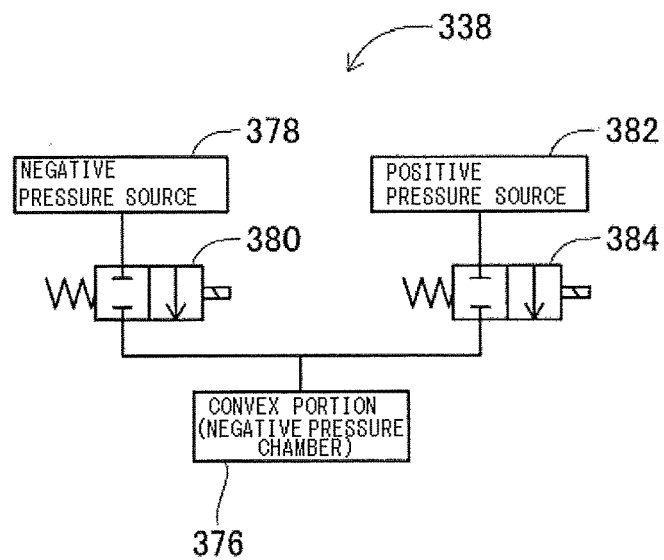
FIG. 17 is a schematic view illustrating a nozzle attachment device.

The nozzle attachment device 338 is a device for attaching the suction nozzle 332 to be attachable and detachable to the nozzle holding member 358. As illustrated in FIG. 17, the nozzle attachment device 338 includes a recessed section 376, a negative pressure source 378, an electromagnetic valve 380, a positive pressure source 382, and an electromagnetic valve 384. The recessed section 376 is formed in an abutting surface between the nozzle holding member 358 and the suction nozzle 332, and functions as a negative pressure chamber. The negative pressure source 378 and the positive pressure source 382 are connected to the recessed section 376, and an electromagnetic valve 380 is arranged in a path between the recessed section 376 and the negative pressure source 378, and the electromagnetic valve 384 is arranged in the path between the recessed section 376 and the positive pressure source 382. Therefore, in a state in which the suction nozzle 332 is in contact with the abutting surface of the nozzle holding member 358 and the recessed section 376 is blocked by the suction nozzle 332, the suction nozzle 332 is held by the nozzle holding member 358 due to the negative pressure being supplied to the recessed section 376 through the operation of the electromagnetic valve 380. Through the operation of the electromagnetic valve 384, the positive pressure is supplied to the recessed section 376, whereby the suction nozzle 332 which is held by the nozzle holding member 358 is detached.

The suction nozzle 332 sucks and holds the component using negative pressure, and there is a multiple types of suction nozzle 332 which have different suction surface sizes of the suction pipe, for example, different nozzle diameters, which is the diameter of the suction pipe. Therefore, as illustrated in FIG. 3, a nozzle accommodation device 386 is provided on the main body 80 in the bulk component supply device 32. Multiple types of the suction nozzle 332 which have different nozzle diameters are stored in the nozzle accommodation device 386, the component holding head 302 is caused to move to the nozzle accommodation device 386 by the component holding head moving device 300 as necessary, and the suction nozzle 332 which is mounted to the component holding head 302 and the suction nozzle 332 which is stored in the nozzle accommodation device 386 are automatically exchanged.

(iii) Shuttle Device

As illustrated in FIG. 3, each of the two shuttle devices 304 includes a component carrier 388 and a component carrier moving device 390, and the shuttle devices 304 are fixed to the main body 80 to line up in the horizontal direction on the front side of the component supply units 98. Five component receiving members 392 are mounted to the component carrier 388 in a state of being lined up in a single row in the horizontal direction, and the components are placed on each of the component receiving members 392.

Figure 18:
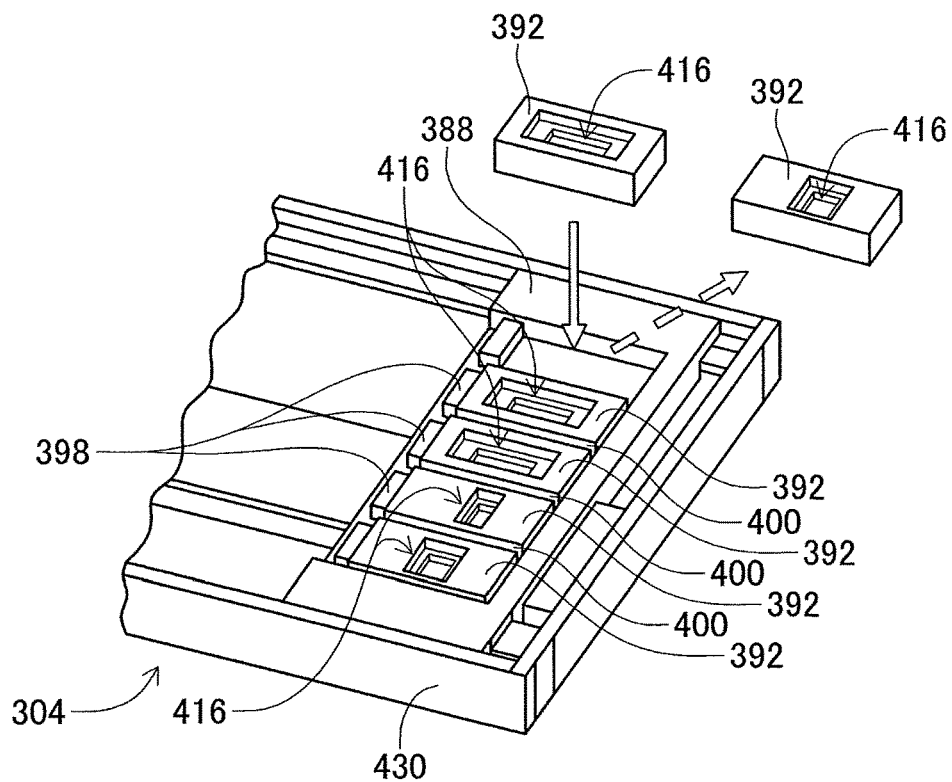
FIG. 18 is a perspective view illustrating a component carrier of a shuttle device.
Figure 19:
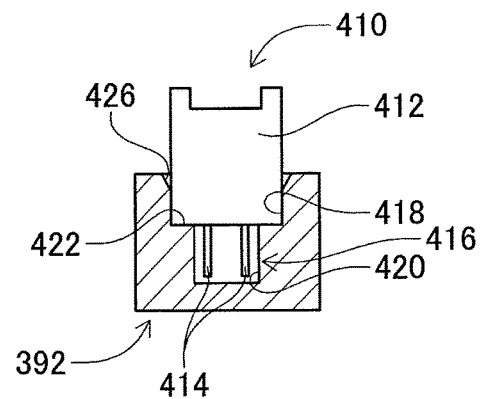
FIG. 19 is a sectional view illustrating a component receiving member of the component carrier.

Specifically, as illustrated in FIG. 18, the component receiving member 392 is fitted to be attachable and detachable in a recessed section 396 of the component carrier 388, and is positioned in the front-rear direction and the horizontal direction by convex portions 398 and 400, respectively. As illustrated in FIG. 19, the component which is supplied by the bulk component supply device 32 is an electronic circuit component (hereinafter may be abbreviated to "lead component") 410 which includes leads, and the lead component 410 is formed of a block-shaped component main body 412, and two leads 414 which protrude from the bottom face of the component main body 412.

A component receiving recessed section 416 is formed in the component receiving member 392. The component receiving recessed section 416 is a step-shaped recessed portion, and is formed of a main body section receiving recessed section 418 which is open to the upper face of the component receiving member 392, and a lead receiving recessed section 420 which is open to the bottom face of the main body section receiving recessed section 418. The opening of the lead receiving recessed section 420 is smaller than the opening of the main body section receiving recessed section 418, and a step surface 422 is formed between the lead receiving recessed section 420 and the main body section receiving recessed section 418. The edge portion of the opening of the lead receiving recessed section 420 is chamfered, and a guide surface 426 is formed. The component main body 412 of the lead component 410 is inserted into the main body section receiving recessed section 418 of the component receiving recessed section 416 along the guide surface 426. In this case, the lead component 410 is set to a posture at which the leads 414 face downward, and the leads 414 are inserted into the lead receiving recessed section 420. The depth dimension of the lead receiving recessed section 420 is deeper than the length dimension of the leads 414. Therefore, the lead component 410 is placed in the inner portion of the component receiving recessed section 416 in a state in which the bottom face of the lead component 410 is supported by the step surface 422 from below. Incidentally, each of the main body section receiving recessed section 418 and the lead receiving recessed section 420 of the component receiving recessed section 416 is a shape corresponding to the shape, dimensions, and the like of the lead component 410 which is placed in the component receiving recessed section 416, and multiple types of the component receiving member 392 exist. Therefore, it is possible to exchange the component receiving member 392 which is mounted to the component carrier 388 according to the lead component 410 which is placed in the component receiving recessed section 416.

As illustrated in FIG. 3, the component carrier moving device 390 includes a moving device main body 430, and a main body slide device 432. The moving device main body 430 is a plate shaped longitudinal member, and is arranged on the front side of the component supply unit 98 so as to extend in the front-rear direction. A guide rail 434 is arranged on the upper face of the moving device main body 430 so as to extend in the longitudinal direction of the moving device main body 430, and the component carrier 388 is engaged with the guide rail 434. Accordingly, the component carrier 388 slides along the guide rail 434 on the upper face of the guide rail 434.

The main body slide device 432 includes an endless belt 436 and an electromagnetic motor (not illustrated). Multiple pulleys (not illustrated) which are capable of rotating around an axial line which is parallel to the horizontal direction are arranged on both ends of the moving device main body 430 in the longitudinal direction, and the endless belt 436 is wrapped around the multiple pulleys Due to the pulley rotating through the driving of the electromagnetic motor, the endless belt 436 pivots. The component carrier 388 is fixed to the endless belt 436. Accordingly, the component carrier 388 slides on the upper face of the guide rail 434 to an arbitrary position in the front-rear direction. When the component carrier 388 slides in a direction approaching the component supply unit 98, the component holding head 302 slides to the component receiving position which is positioned within the movement range of the component holding head 302 due to the component holding head moving device 300. On the other hand, when the component carrier 388 slides in a direction separating from the component supply unit 98, the component carrier 388 slides to the component supply position which is positioned within the movement range of the work heads 60 and 62 by the work head moving device 64.

Operation of Component Mounting Device The component mounting device 10, according to the configuration which is described above, mounting work of the components onto the circuit substrate 12 which is held by the substrate conveying and holding device 22 is performed. Specifically, the circuit substrate 12 is conveyed to a working position, and is held at the position by the clamping device 52 in a fixed manner. Next, the imaging device 26 moves above the circuit substrate 12 and images the circuit substrate 12. Accordingly, information relating to the error of the holding position of the circuit substrate 12 is obtained. The component supply device 30 or the bulk component supply device 32 supplies the components at a predetermined supply position. Detailed description relating to the supplying of the components by the bulk component supply device 32 will be given later. Either of the work heads 60 and 62 moves above the supply position of the component and holds the component using the component holding tool 66. Next, the work head 60 or 62 which holds the component moves above the imaging device 28, and the components which is held by the component holding tool 66 is imaged by the imaging device 28. Accordingly, information relating to the error of the holding position of the component is obtained. The work head 60 or 62 which holds the component moves above the circuit substrate 12, corrects the error of the holding position of the circuit substrate 12, the error of the holding position of the component, and the like, and mounts the component onto the circuit substrate 12.

Operation of Bulk Component Supply Device (a) Supply of Lead Component by Bulk Component Supply Device In the bulk component supply device 32, the lead component 410 is charged into the component storage device 100 of the component feeder 82 by the operator, and the charged lead component 410 is supplied in a state of being placed on the component receiving member 392 of the component carrier 388 through the operation of the component supply unit 98 and the component delivery device 90. Specifically, the operator charges multiple lead components 410 of the same type from the opening on the upper face of the component storage device 100 of the component feeder 82 of an arbitrary component supply unit 98 among the five component supply units 98. At this time, as illustrated in FIG. 8, the component support member 220 is moved to the retraction position below the component feeder 82 through the operation of the component support member moving device 222, and the component collecting container 262 is positioned in front of the component feeder 82.

As illustrated in FIG. 6, the lead components 410 which are charged from the opening in the upper face of the component storage device 100 fall from the charging section 110 of the component storage device 100 into the storage section 112 via the opening 114. In this case, the lead components 410 which fall roll on the inclined surface 116 and spread out on the inclined surface 116. If the lead components 410 block the opening 114 and the opening 114 enters a blocked state, the multiple lead components 410 charged from the opening in the upper face of the component storage device 100 assume a state of being stacked in bulk in the charging section 110. Even in a case in which the lead components 410 which fall onto the inclined surface 116 exceed the inclined plate 152 and roll off, the lead components 410 are housed in the component collecting container 262 which is positioned in front of the component feeder 82.

Figure 20:
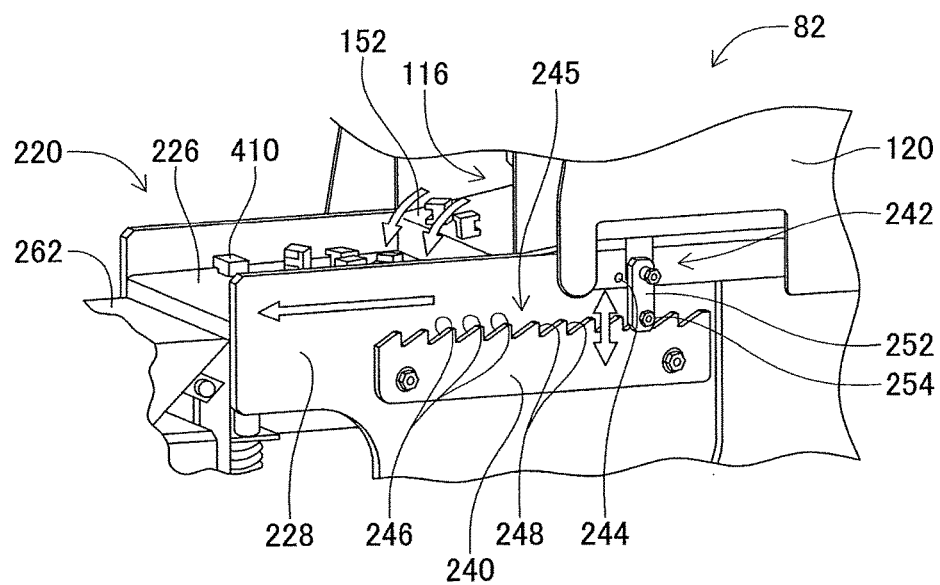
FIG. 20 is a perspective view illustrating a component scattered state realization device.

After the charging of the lead components 410 to the component storage device 100, the component support member 220 is caused to move from under the component feeder 82 toward the front through the operation of the component support member moving device 222. In this case, if the cam member 240 reaches the cam follower 242, as illustrated in FIG. 20, the roller 254 of the cam follower 242 is lifted along the inclined surface 246 of the teeth 245 of the cam member 240. The roller 254 surpasses the teeth 245 on the vertical surface 248 of the teeth 245. The lever 252 of the cam follower 242 is biased in a direction toward the front by the elastic force of a coil spring, and the biasing of the lever 252 to the front is restricted by the stopper 244. Therefore, when the component support member 220 moves toward the front, the component support member 220 is maintained in a state in which the roller 254 meshes with the teeth 245, the lever 252 does not rotate toward the front, and the roller 254 surpasses the teeth 245. In this case, the component feeder 82 is lifted due to the surpassing of the teeth 245 of the roller 254. In other words, in a state in which the roller 254 meshes with the teeth 245, the component support member 220 moves toward the front, whereby the roller 254 surpasses the multiple teeth 245, and the component feeder 82 continuously vibrates in the up-down direction.

The lead components 410 which are spread out on the inclined surface 116 of the component storage device 100 moves to the front due to the vibration of the component feeder 82 and the inclination of the inclined surface 116, and are discharged onto the upper face of the component support section 226 of the component support member 220 via the inclined plate 152. In this case, the falling of the lead components 410 from the upper face of the component support section 226 is prevented by the leg sections 228 of the component support member 220. Due to the vibration of the component feeder 82, the lead components 410 which block the opening 114 fall onto the inclined surface 116 via the opening 114, and are discharged onto the upper face of the component support section 226 via the inclined plate 152. As the component support member 220 moves to the front, the area of the component support section 226 which are exposed from the bottom of the component feeder 82 increases, and the lead components 410 are sequentially discharged onto the component support section 226 corresponding to the increased area. At a timing at which the roller 254 surpasses the teeth 245, the component feeder 82 vibrates, and the lead components 410 are discharged from the component feeder 82 onto the upper face of the component support section 226. The cam member 240 is disengaged from the cam follower 242 before the component support member 220 reaches the component supply position. Therefore, when the cam member 240 is disengaged from the cam follower 242 and the component support member 220 moves to the component supply position, the component feeder 82 does not vibrate, and the lead components 410 are not discharged from the component feeder 82 onto the upper face of the component support section 226. In this manner, in the component supply unit 98, the multiple lead components 410 are scattered on the upper face of the component support section 226 in a state in which the component support member 220 reaches the component supply position.

When the component support member 220 reaches the component supply position, the camera 290 of the imaging device 88 is caused to move above the component support section 226 on which the lead components 410 are scattered through the operation of the camera moving device 292, and the camera 290 images the lead components 410. Based on the captured image data, the multiple lead components 410 which are scattered on the upper face of the component support section 226 are divided into lead components (hereinafter sometimes referred to as "pickup target components") that can be picked up by the suction nozzle 332, and a lead component (hereinafter sometimes referred to as "non-pickup target components") that may not be picked up by the suction nozzle 332. Since the method of dividing the pickup target components from the non-pickup target components is not related to the disclosure, a brief description will be given. The lead components 410 which are in a state in which a surface difficult to suck such as an uneven surface faces upwards, the lead components 410 which are in a state in which the leads 414 are in contact with the upper face of the component support section 226 and are inclined, and the like are classified as non-pickup target components, and the other lead components 410 are classified as pickup target components. Information such as the position on the component support section 226, the posture of the lead components 410, and the like is acquired for the lead components 410 which are classified as the pickup target components based on the captured image data.

The component holding head 302 is moved above the pickup target component through the operation of the component holding head moving device 300 based on the acquired positional information of the pickup target component, and the pickup target component is sucked and held by the suction nozzle 332. When the pickup target component is sucked and held by the suction nozzle 332, the suction nozzle 332 is positioned at the non-pivoting position.

After the pickup target component is held by the suction nozzle 332, the component holding head 302 is caused to move above the component carrier 388, and, at this time, the component carrier 388 is caused to move to the component receiving position through the operation of the component carrier moving device 390. When the component holding head 302 moves above the component carrier 388, the suction nozzle 332 is caused to revolve to the pivoting position. However, since the revolving direction of the suction nozzle 332 is a single direction, the leads 414 of the lead component 410 which is held by the suction nozzle 332 at the pivoting position may face downward in the vertical direction. Therefore, in order that the leads 414 of the lead component 410 which is held by the suction nozzle 332 at the pivoting position faces downward in the vertical direction, the holding posture by the suction nozzle 332 is calculates based on the posture information of the pickup target component on the component support section 226. The suction nozzle 332 is caused to rotate by the nozzle rotation device 336 before holding the pickup target component such that the pickup target component may be held with the calculated holding posture. Accordingly, the lead component 410 which is held by the suction nozzle 332 of the pivoting position enters a state in which leads 414 face downward in the vertical direction.

When the component holding head 302 is caused to move above the component carrier 388, the lead component 410 which is in a state in which the leads 414 face downward in the vertical direction is inserted into the component receiving member 392 along the guide surface 426. In this case, the lead component 410 is placed on the component receiving member 392 in a state in which the leads 414 face downward in the vertical direction. The component carrier 388 moves to the component supply position through the operation of the component carrier moving device 390. Since the component carrier 388 which is moved to the component supply position is positioned in the movement range of the work heads 60 and 62, the lead component 410 is supplied at this position in the bulk component supply device 32. Accordingly, the lead component 410 which is placed on the component receiving member 392 of the component carrier 388 at the component supply position is held by the component holding tools 66 of the work heads 60 and 62. In this manner, in the bulk component supply device 32, the lead component 410 is supplied in a state in which the leads 414 face downward, and the surface facing the surface to which the leads 414 are connected faces upward. Therefore, the component holding head 302 becomes capable of appropriately holding the lead component 410.

The movement range of the component holding head 302 by the component holding head moving device 300, and the movement range of the camera 290 by the camera moving device 292 are different from each other, as described above. Therefore, each time the pickup target component is picked up by the component holding head 302, the camera 290 is capable of obtaining the positional information of the pickup target component in a state of being positioned above the component support member 220. Specifically, the lead component 410 on the component support member 220 is imaged by the camera 290 which is positioned above the component support member 220. Based on the captured image data, the work of picking up is performed by the component holding head 302, and the pickup target component which is picked up is placed on the component receiving member 392. In this case, the component holding head 302 is moved over the component carrier 388 of the shuttle device 304, and is not positioned above the component support member 220. Therefore, the lead component 410 on the component support member 220 is imaged by the camera 290 at a timing at which the component holding head 302 is moved to above the component carrier 388. The work of picking up a new pickup target component is performed by the component holding head 302 based on the captured image data. Accordingly, it becomes possible to perform the work of picking up based on the newest information, and it becomes possible to secure appropriate pickup work.

(b) Collection of Lead Components to Component Storage Device

Figure 21:
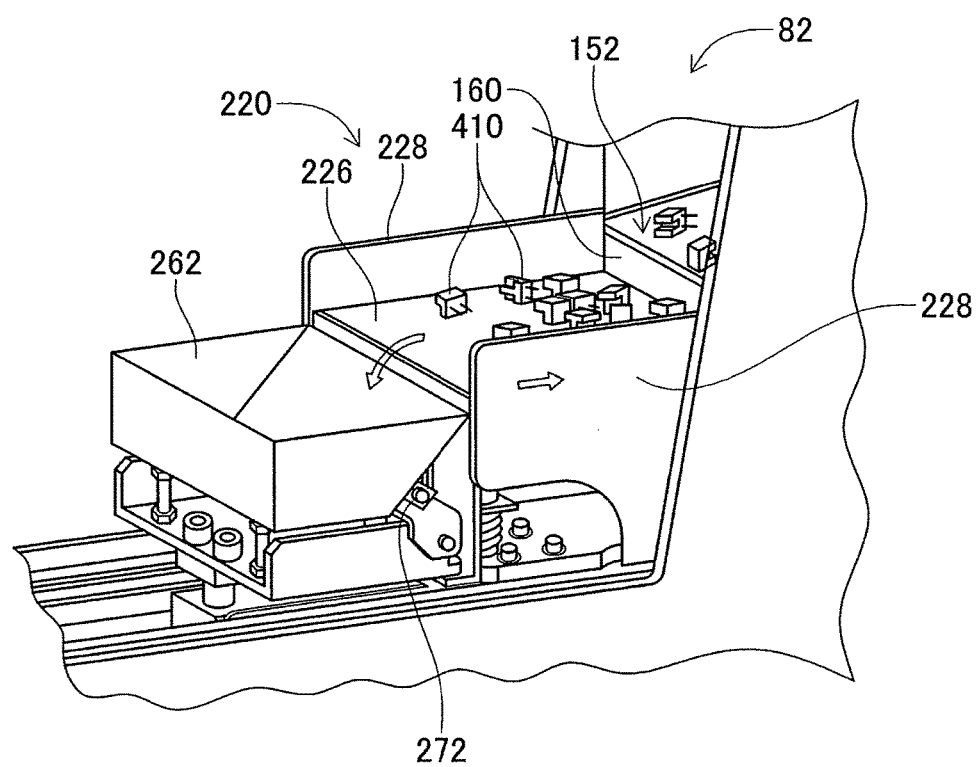
FIG. 21 is a perspective view illustrating the component scattered state realization device and the component returning device.

When the work of picking up the pickup target components that are scattered on the component support member 220 advances, many non-pickup target components remain on the component support member 220. In such a case, the lead components 410 on component support member 220 are returned to the component storage device 100 through the operation of the component returning device 86. Specifically, when the lead components 410 are returned to the component storage device 100, first, the component support member 220 is caused to move toward to the bottom of the component feeder 82 through the operation of the component support member moving device 222. In this case, as illustrated in FIG. 21, the lead component 410 on the component support member 220 is blocked by the third inclined surface 160 of the inclined plate 152 of the component feeder 82. Therefore, when the component support member 220 moves toward the bottom of the component feeder 82, the lead component 410 on the component support member 220 moves forward relative to the component support member 220, and is scraped off into the inner portion of the component collecting container 262.

When the component support member 220 moves to the bottom of the component feeder 82, a force in the same direction as the movement direction of the component support member 220 acts on the cam follower 242 from the cam member 240, and, as illustrated in FIG. 9, the lever 252 of the cam follower 242 rotates against the elastic force of the coil spring. Therefore, when the roller 254 of the cam follower 242 surpasses the teeth 245 of the cam member 240, the lever 252 rotates and the component feeder 82 does not vibrate. Accordingly, when the component support member 220 moves toward the bottom of the component feeder 82, the lead component 410 is not discharged from the component storage device 100 to the component support member 220.

After the component support member 220 moves below the component feeder 82, that is, after the component support member 220 moves to the retraction position, as illustrated in FIG. 12, the component collecting container 262 is lifted through the operation of the container lifting and lowering device 260. In this case, as the component collecting container 262 is lifted, the shutter 265 is lifted due to the elastic force of the coil spring 282, and blocks the front of the inclined plate 152 of the component feeder 82, as illustrated in FIG. 13. Accordingly, the discharging of the lead components 410 from the component feeder 82 is prevented.

When the component collecting container 262 is further lifted, the protruding pin 272 which is arranged on the component collecting container 262 engages with the engaging block 274 which is arranged on the inside of the side frame section 190. Accordingly, as illustrated in FIG. 10, the component collecting container 262 rotates. In this case, the bottom face of the component collecting container 262 becomes vertical, and the wall surface of the component storage device 100 side of the component collecting container 262 becomes an inclined surface which is inclined toward the component storage device 100. Therefore, the lead components 410 inside the component collecting container 262 are all returned to the inner portion of the component storage device 100.

Figure 22:
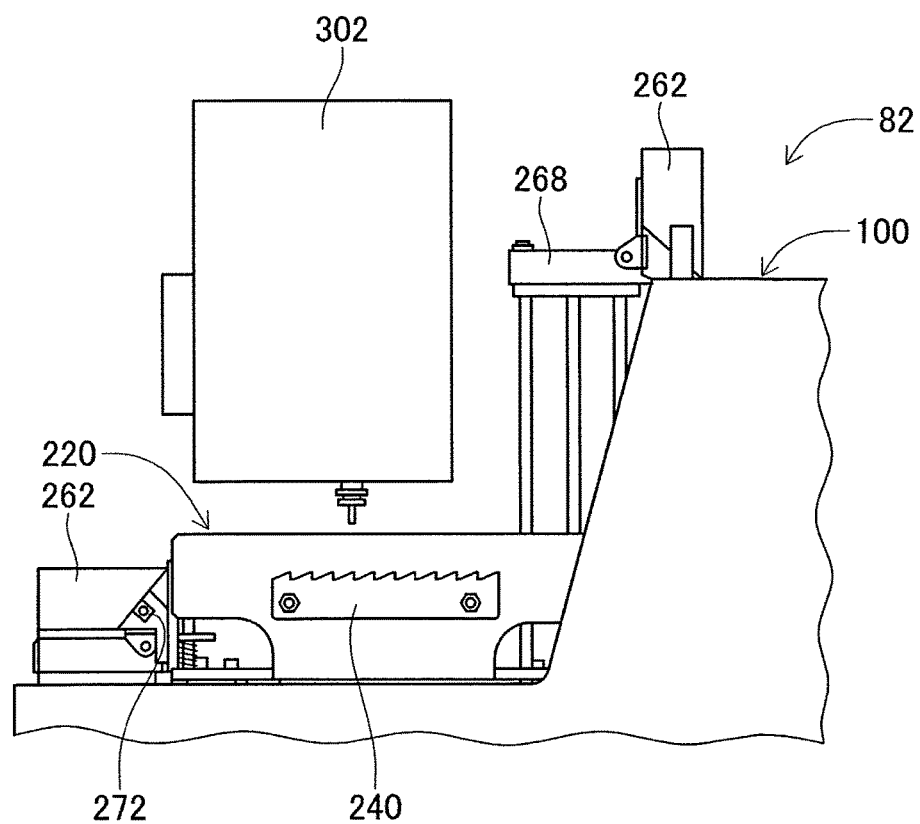
FIG. 22 is a view illustrating the positional relationship between the component returning device and the component holding head.

When the lead component 410 is returned to the inner portion of the component storage device 100, it is possible to perform the work of supplying the lead components 410 in the other component supply unit 98 from the component supply unit 98 in which the work of returning the lead components 410 is being performed. Specifically, when the cam follower 242 is engaged with the cam member 240 and the component feeder 82 is vibrating, the lead components 410 are discharged onto the component support member 220. Therefore, the lead components 410 are scattered on the upper face of a side of the component support member 220 which is separated from the component feeder 82, that is, the front side. On the other hand, as illustrated in FIG. 22, the component collecting container 262 is lifted at the position closest to the component feeder 82, and the lead components 410 inside the component collecting container 262 are returned to the component storage device 100. Therefore, even if the work of picking up the lead components 410 on the component support member 220 of the other component supply unit 98 from the component supply unit 98 in which the work of returning the lead components 410 is being performed, the component holding head 302 does not interfere with the component collecting container 262. Accordingly, it is possible to simultaneously perform the work of returning the lead components 410 in the predetermined component supply unit 98, and the work of supplying the lead components 410 in the different component supply unit 98 from the predetermined component supply unit 98.

(c) Exchanging of Lead Components

Figure 23:
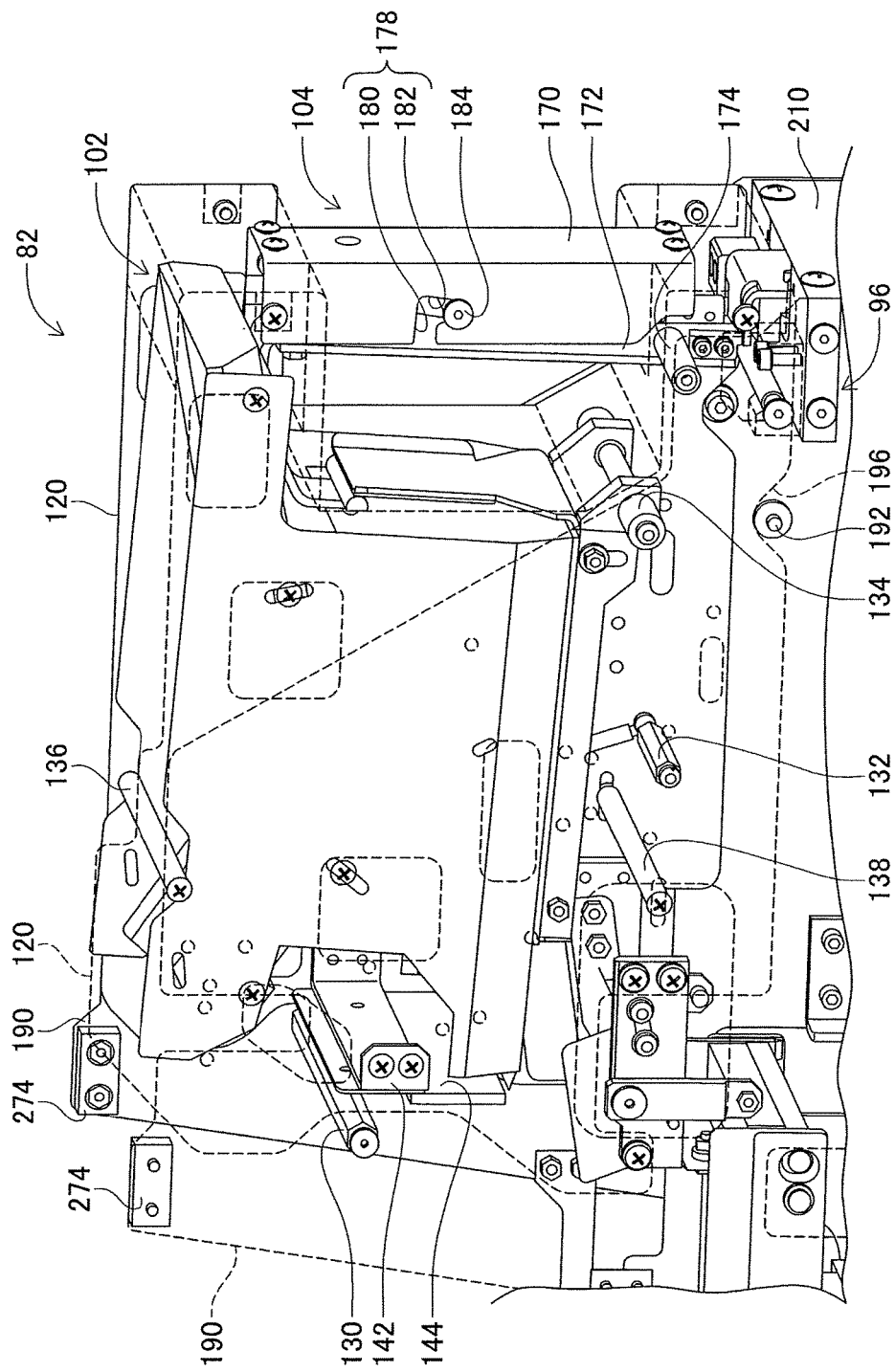
FIG. 23 is a perspective view illustrating the component feeder.

When the circuit substrate 12 as the production target is changed, it is necessary to replace the lead components 410 to be supplied. In such a case, the component feeder 82 is removed from the frame 96, and the component feeder 82 corresponding to a new type of the lead component 410 is mounted on the frame 96. Specifically, after the lead components 410 on the component support member 220 are returned to the inner portion of the component storage device 100, the operator grips the grip 104 of the component feeder 82, and as illustrated in FIG. 23, the movable gripping member 172 is caused to rock toward the fixed gripping member 170. In this case, the engagement member 184 of the movable gripping member 172 proceeds to the inner portion of the first cutout portion 180 of the fixed gripping member 170. When the engagement member 184 reaches the top end of the second cutout portion 182, the engagement member 184 drops to the bottom end of the second cutout portion 182 due to the weight of the component feeder 82. Accordingly, the engagement of the claw member 216 which is attached to the bottom end of the movable gripping member 172 to the engagement rod 214 is released, and it becomes possible to remove the component feeder 82 from the frame 96, that is, from between the pair of side frame sections 190.

Figure 24:
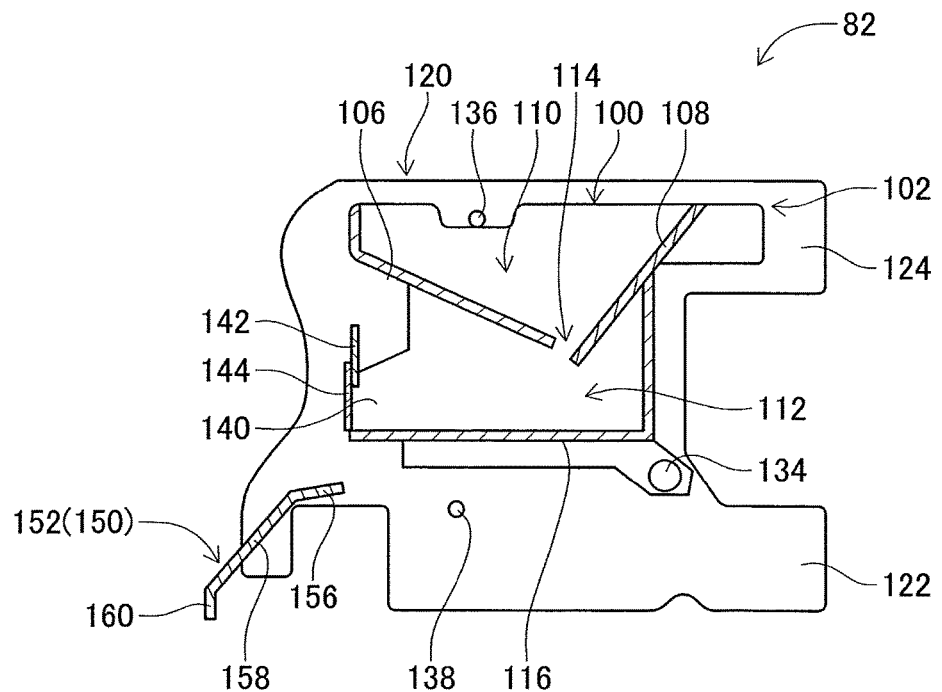
FIG. 24 is a sectional view illustrating the component feeder.

When the grip 104 is gripped and the movable gripping member 172 rocks toward the fixed gripping member 170, the component storage device 100 rocks toward the rear around the support shaft 134 in the inner portion of the housing 102. In this case, as illustrated in FIG. 24, the end portion of the front side of the inclined surface 116 of the component storage device 100 approaches or comes into contact with the distal end portion of the brush 144. Accordingly, it becomes possible to prevent the lead components 410 from being discharged from the inner portion of the component storage device 100 when the component feeder 82 is removed from the frame 96. Even in a case in which the lead components 410 are jammed between the brush 144 and the inclined surface 116, it is possible to prevent breakage of the lead components 410 through the elastic deformation of the brush 144. Furthermore, since the engagement member 184 of the movable gripping member 172 is dropped onto the bottom end of the second cutout portion 182 of the fixed gripping member 170, after the operator removes the component feeder 82 from the frame 96, even if the hand is released from the grip 104, the movable gripping member 172 does not rock due to the elastic force of the spring, and the position of the component storage device 100 is maintained. Therefore, even in a case in which the operator releases the hand from the grip 104 after the operator removes the component feeder 82 from the frame 96, the inclined surface 116 of the component storage device 100 and the distal end portion of the brush 144 are close or in contact with each other, thereby preventing the lead components 410 from being discharged from the inner portion of the component storage device 100.

When the component feeder 82 is removed from the frame 96, the component feeder 82 corresponding to the new type of lead component 410 is inserted between the pair of side frame sections 190. In this case, as illustrated in FIG. 23, the cutout portion 196 which is formed at the bottom end portion of the side wall 120 of the component feeder 82 is engaged with the engaging pin 192 of the side frame portion 190, and as illustrated in FIG. 5, the engaging pin 206 which is provided at the front end portion of the side wall 120 is engaged with the inclined surface 202 of the support member 200 of the side frame section 190. Accordingly, the component feeder 82 is positioned between the pair of side frame sections 190. Due to the operator moving the engagement member 184 of the grip 104 from the bottom end to the top end of the second cutout portion 182, the movable gripping member 172 rocks in a direction separating from the fixed gripping member 170 due to the elastic force of the spring. In this case, the claw member 216 which is attached to the bottom end portion of the movable gripping member 172 engages with the engagement rod 214. Accordingly, the component feeder 82 is locked to the frame 96.

When the movable gripping member 172 rocks in a direction separating from the fixed gripping member 170, the component storage device 100 rocks toward the front around the support shaft 134 in the inner portion of the housing 102. In this case, as illustrated in FIG. 6, the end portion of the front side of the inclined surface 116 of the component storage device 100 moves downward, and the space between the distal end portion of the brush 144 and the inclined surface 116 is opened. Accordingly, it becomes possible to discharge the lead components 410 which are charged into the component storage device 100 from the storage section 112. In this manner, in the bulk component supply device 32, it becomes possible to easily exchange the lead components 410 to be supplied by exchanging the component feeders 82.

When the component feeders 82 are exchanged, the ID information is transmitted from the RFID 217 of the component feeder 82 which is newly attached to the frame 96, and the receiver 218 which is provided on the frame main body section 210 of the frame 96 transmits and receives the ID information. Collation of the lead components 410 which are supplied by the component feeder 82 which is newly attached to the frame 96 is performed based on the ID information.

Incidentally, in the example described above, the bulk component supply device 32 is an example of the component supply device. The component feeder 82 is an example of the storage section. The frame 96 is an example of the mounting section. The brush 144 is an example of the closing member. The RFID 217 is an example of the identification information recording medium. The component support member 220 is an example of the component support section. The ID information which transmitted by the RFID 217 is an example of the identification information.

The disclosure is not limited to the examples and modification examples described above, and it is possible to carry out the disclosure in various aspects subjected to various modifications and improvements based on the knowledge of a person skilled in the art. Specifically, for example, in the example described above, the lead components 410 to be supplied are exchanged by exchanging the component feeders 82; however, the lead components 410 may be exchanged by a single component feeder 82. In other words, after removing the component feeder 82 from the frame 96, of the lead components 410 are taken out from the inner portion of the component feeder 82. The component feeder 82 is once again mounted to the frame 96, and a new type of lead component 410 may be charged into the component feeder 82 which is mounted to the frame 96. A new type of lead component 410 is charged into the component feeder 82 from the inner portion of which all the lead components 410 are removed, and the component feeder 82, which is in the state in which a new type of lead component 410 is stored in the inner portion, may be mounted to the frame 96.

In the example described above, as the component storage device 100 rocks in the inner portion of the housing 102, the opening for discharging the lead components 410 of the component storage device 100 is closed by the brush 144. In other words, at the timing at which the locking of the component feeder 82 to the frame 96 is released, the opening of the component storage device 100 is closed by the brush 144; however, it is possible to close the opening of the component storage device 100 at an arbitrary timing. Specifically, for example, a closing member such as a shutter is arranged so as to be capable of sliding between an open position for opening the opening of the component storage device 100 and a close position for closing the opening. The closing member is caused to slide through the operation of an actuator such as an electromagnetic motor. Accordingly, it is possible to close the opening of the component storage device 100 at an arbitrary timing.

In the example described above, information relating to the lead components 410 which are supplied by the component feeder 82 is transmitted as identification information by the RFID 217; however, it is possible to transmit information relating to the component feeder 82. In this case, the information relating to the component feeder 82 and the information relating to the lead components 410 which are supplied by the component feeder 82 are stored in association with each other in the bulk component supply device 32, and the information relating to the lead components 410 which are supplied by the component feeder 82 is extracted based on the received information relating to the component feeder 82. The collation of the components is performed based on the extracted information. It is possible to record the identification information in a bar code, a 2D code, or the like, and to write the bar code, the 2D code, or the like in the component feeder 82. In this case, the identification information is read using a code reader or the like.

REFERENCE SIGNS LIST

32: bulk component supply device (component supply device), 82: component feeder (storage section), 96: frame (mounting section), 144: brush (closing member), 217: RFID (identification information recording medium), 220: component support member (component support section)

The invention claimed is:

1. A component supply device comprising:
a storage section which stores multiple components;
a mounting section to which the storage section is mounted;
a component support section which supports, in a scattered state, multiple components which are discharged from an opening of the storage section which is in a state of being mounted to the mounting section;
a component support member moving device which moves the component support section from forward of the storage section toward a bottom of the storage section so that a non-pickup target component remaining on the component support section is collected into a component collecting container; and
a component return device that lifts the component collecting container and returns the non-pickup target component collected in the component collecting container to the storage section,
wherein the storage section is attachable and detachable in relation to the mounting section.

2. The component supply device according to claim 1,
wherein the storage section includes an identification information recording medium on which identification information for identifying the storage section is recorded.

3. The component supply device according to claim 1,
wherein the storage section includes a closing member which is capable of moving between an open position at which the opening of the storage section is opened allowing the components to be discharged from the opening, and a close position at which at least a portion of the opening of the storage section is blocked preventing the components from being discharged from the opening.

4. The component supply device according to claim 1,
wherein the closing member is formed using a material which is capable of elastic deformation.

5. The component supply device according to claim 1,
wherein when the component support member moving device moves the component support section toward the bottom of the storage section, the component support member is inserted into the storage section, and the non-pickup target component is scraped into the component collecting container by contact with a portion of the storage section.

6. A component supply device comprising:
a storage section which stores multiple components;
a mounting section to which the storage section is mounted;
a component support section which supports, in a scattered state, multiple components which are discharged from an opening of the storage section which is in a state of being mounted to the mounting section;
a component support member moving device which moves the component support section from forward of the storage section toward a bottom of the storage section so that a non-pickup target component remaining on the component support section is collected into a component collecting container; and
a component return device that returns the non-pickup target component collected in the component collecting container so that the non-pickup target component is scattered on the component support section again,
wherein the storage section is attachable and detachable in relation to the mounting section.

* * * * *